US007795080B2

(12) United States Patent
Orimoto et al.

(10) Patent No.: US 7,795,080 B2
(45) Date of Patent: Sep. 14, 2010

(54) METHODS OF FORMING INTEGRATED CIRCUIT DEVICES USING COMPOSITE SPACER STRUCTURES

(75) Inventors: Takashi Orimoto, Sunnyvale, CA (US); George Matamis, San Jose, CA (US); James Kai, Santa Clara, CA (US); Tuan Pham, San Jose, CA (US); Masaaki Higashitani, Cupertino, CA (US); Henry Chien, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 132 days.

(21) Appl. No.: 12/014,689

(22) Filed: Jan. 15, 2008

(65) Prior Publication Data

US 2008/0171406 A1    Jul. 17, 2008

Related U.S. Application Data

(60) Provisional application No. 60/885,008, filed on Jan. 15, 2007.

(51) Int. Cl.
*H01L 21/82* (2006.01)
(52) U.S. Cl. ..................................... 438/129; 438/128
(58) Field of Classification Search ................ 257/296, 257/314, 315, 316, 392, 396; 438/239, 257, 438/264, 268, 275, 301, 396, 401, 585, 696, 438/700, 712, 735, 129

(56) References Cited

U.S. PATENT DOCUMENTS 5,459,091 A    10/1995   Hwang (Continued)

OTHER PUBLICATIONS

Choi, Yang-Kyu, et al., "Sublithographic nanofabrication technology for nanocatalysts and DNA chips," J.Vac. Sci. Technol. B 21(6), American Vacuum Society, Nov./Dec. 2003, pp. 2951-2955.

(Continued)

*Primary Examiner*—Thanh V Pham
*Assistant Examiner*—Errol Fernandes
(74) *Attorney, Agent, or Firm*—Vierra Magen Marcus & DeNiro LLP

(57) ABSTRACT

Methods of fabricating integrated circuit devices are provided using composite spacer formation processes. A composite spacer structure is used to pattern and etch the layer stack when forming select features of the devices. A composite storage structure includes a first spacer formed from a first layer of spacer material and second and third spacers formed from a second layer of spacer material. The process is suitable for making devices with line and space sizes at less then the minimum resolvable feature size of the photolithographic processes being used. Moreover, equal line and space sizes at less than the minimum feature size are possible. In one embodiment, an array of dual control gate non-volatile flash memory storage elements is formed using composite spacer structures. When forming the active areas of the substrate, with overlying strips of a layer stack and isolation regions therebetween, a composite spacer structure facilitates equal lengths of the strips and isolation regions therebetween.

8 Claims, 20 Drawing Sheets

U.S. PATENT DOCUMENTS

| | | | |
|---|---|---|---|
| 6,040,220 | A | 3/2000 | Gardner et al. |
| 6,066,534 | A | 5/2000 | Son |
| 6,746,920 | B1 | 6/2004 | Wen et al. |
| 6,888,755 | B2 | 5/2005 | Harari |
| 6,893,919 | B2 * | 5/2005 | Chuang et al. .............. 438/257 |
| 7,026,684 | B2 * | 4/2006 | Sakuma et al. .............. 257/315 |
| 2002/0031887 | A1 * | 3/2002 | Harshfield .................. 438/257 |
| 2006/0108648 | A1 * | 5/2006 | Yuan ........................... 257/396 |
| 2006/0286749 | A1 | 12/2006 | Tseng et al. |
| 2007/0128787 | A1 | 6/2007 | Higashitani |
| 2007/0243680 | A1 | 10/2007 | Harari et al. |

OTHER PUBLICATIONS

U.S. Appl. No. 11/765,866, filed Jun. 20, 2007.
U.S. Appl. No. 11/623,314, filed Jan. 15, 2007.
Chan, et al., "A True Single Transistor Oxide-Nitride-Oxide EEPROM Device," IEEE Electron Device Letters, vol. EDL-8, No. 3, Mar. 1987, pp. 93-95.
Nozaki, et al., "A 1-MbEEPROM with MONOS Memory Cell for Semiconductor Disk Application," Journal of Solid State Circuits, vol. 26, No. 4, Apr. 1991 IEEE, pp. 497-501.

* cited by examiner (y-direction)

(x-direction)

(x-direction)

(x-direction)

(x-direction)

(x-direction)

(x-direction)

(x-direction)

(x-direction)

(x-direction)

(x-direction)

(x-direction)

(x-direction)

(x-direction)

(y-direction)

(y-direction)

(y-direction)

(y-direction)

(y-direction)

(y-direction)

(y-direction)

(y-direction)

(y-direction)

(x-direction)

(x-direction)

(x-direction)

(x-direction)

(y-direction)

(y-direction)

(y-direction)

(y-direction)

METHODS OF FORMING INTEGRATED CIRCUIT DEVICES USING COMPOSITE SPACER STRUCTURES

PRIORITY CLAIM

This application claims the benefit of U.S. Provisional Patent Application No. 60/885,008 entitled, "High Density Semiconductor Devices," by Kai, et al., filed Jan. 15, 2007, which is cross-referenced and incorporated by reference herein in its entirety.

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, Apr. 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes. U.S. Pat. No. 6,888,755, entitled "Flash Memory Cell Arrays Having Dual Control Gates Per Memory Cell Charge Storage Element," by Eliyahou Harari, incorporated herein by reference, describes a memory array with a dual control gate structure. U.S. Pat. No. 7,026,684, entitled "Nonvolatile Semiconductor Memory Device," by Sakuma, et al., incorporated herein by reference, describes a memory with an inverted-T type floating gate structure. The charge storage element is divided into two regions having different dimensions. Fabricating the components of these devices at the specified feature sizes poses numerous demands on the fabrication processes.

SUMMARY OF THE INVENTION

High density semiconductor devices and methods of fabricating the same are provided in accordance with one or embodiments.

Methods of fabricating integrated circuit devices are provided using composite spacer formation processes. A composite spacer structure is used to pattern and etch the layer stack when forming select features of the devices. A composite storage structure includes a first spacer formed from a first layer of spacer material and second and third spacers formed from a second layer of spacer material. The process is suitable for making devices with line and space sizes at less then the minimum resolvable feature size of the photolithographic processes being used. Moreover, equal line and space sizes at less than the minimum feature size are possible. In one embodiment, an array of dual control gate non-volatile flash memory storage elements is formed using composite spacer structures. When forming the active areas of the substrate, with overlying strips of a layer stack and isolation regions therebetween, a composite spacer structure facilitates equal lengths of the strips and isolation regions therebetween.

A method of making a non-volatile memory array using a semiconductor substrate is provided in one embodiment. A first layer of dielectric material is formed over a surface of the substrate, followed by forming a first layer of charge storage material over the first layer of dielectric material. A first set of strips of sacrificial material elongated in a first direction is then formed over the layer stack. The first set of strips has sidewalls extending in the first direction and separated in a second direction with spaces therebetween. The first direction is substantially perpendicular to the second direction. A first set of spacers elongated in the first direction along the sidewalls of the first set of strips of sacrificial material is then formed. The strips of sacrificial material are then removed such that the first set of spacers have exposed first and second sidewalls elongated in the first direction. A second set of spacers elongated in the first direction along the first and second sidewalls of the first set of spacers is formed. The second set of spacers are separated in the second direction with spaces therebetween. The spaces extend a length in the second direction that is substantially equal to a combined length of one spacer of the first set and two spacers of the second set. The first layer of charge storage material and the first layer of dielectric material are etched using the first and second sets of spacers as a mask. Etching forms strips of charge storage material elongated in the first direction across the surface of the substrate with strips of dielectric material therebetween. The substrate is then etched to form trenches elongated in the first direction between strips of charge storage material adjacent in the second direction. The trenches are filled with an insulating material to provide electrical isolation between adjacent active areas of the substrate. An intermediate dielectric layer is formed, followed by control gates separated from the charge storage material by the intermediate dielectric layer.

Other features, aspects, and objects of the disclosed technology can be obtained from a review of the specification, the figures, and the claims.

DETAILED DESCRIPTION

Figure 3:
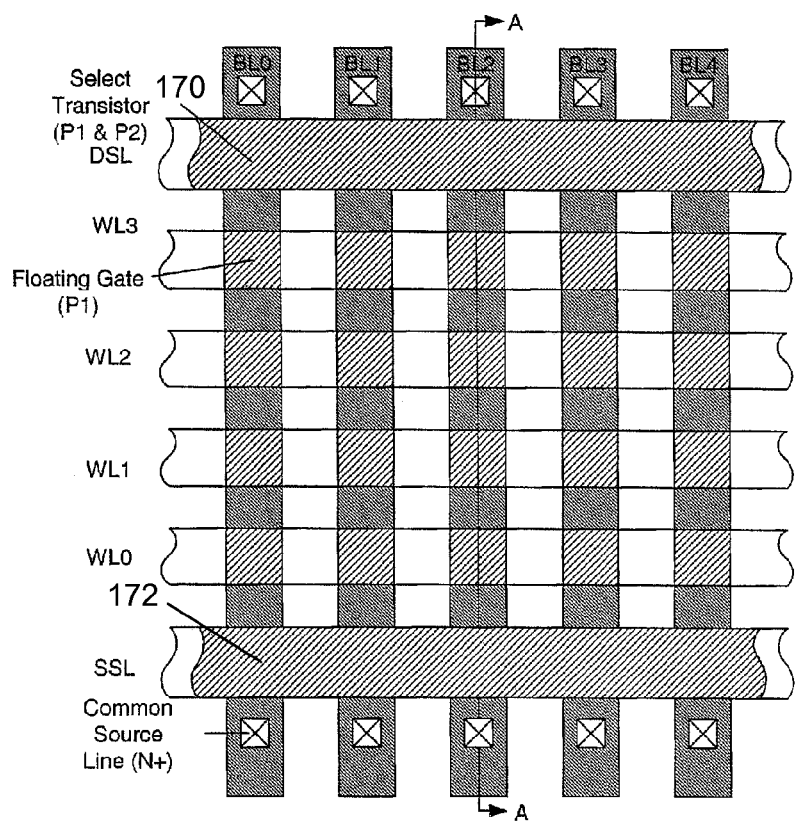
FIG. 3 is a plan view of a portion of a NAND flash memory array.
Figure 4:
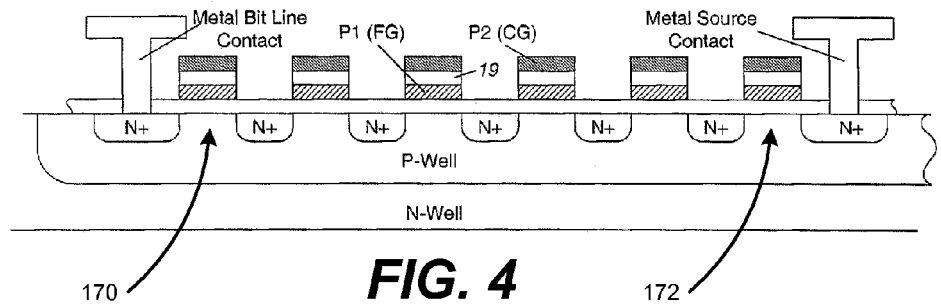
FIG. 4 is an orthogonal cross-sectional view taken along line A-A of the portion of the flash memory array depicted in FIG. 4.

A portion of a traditional NAND memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
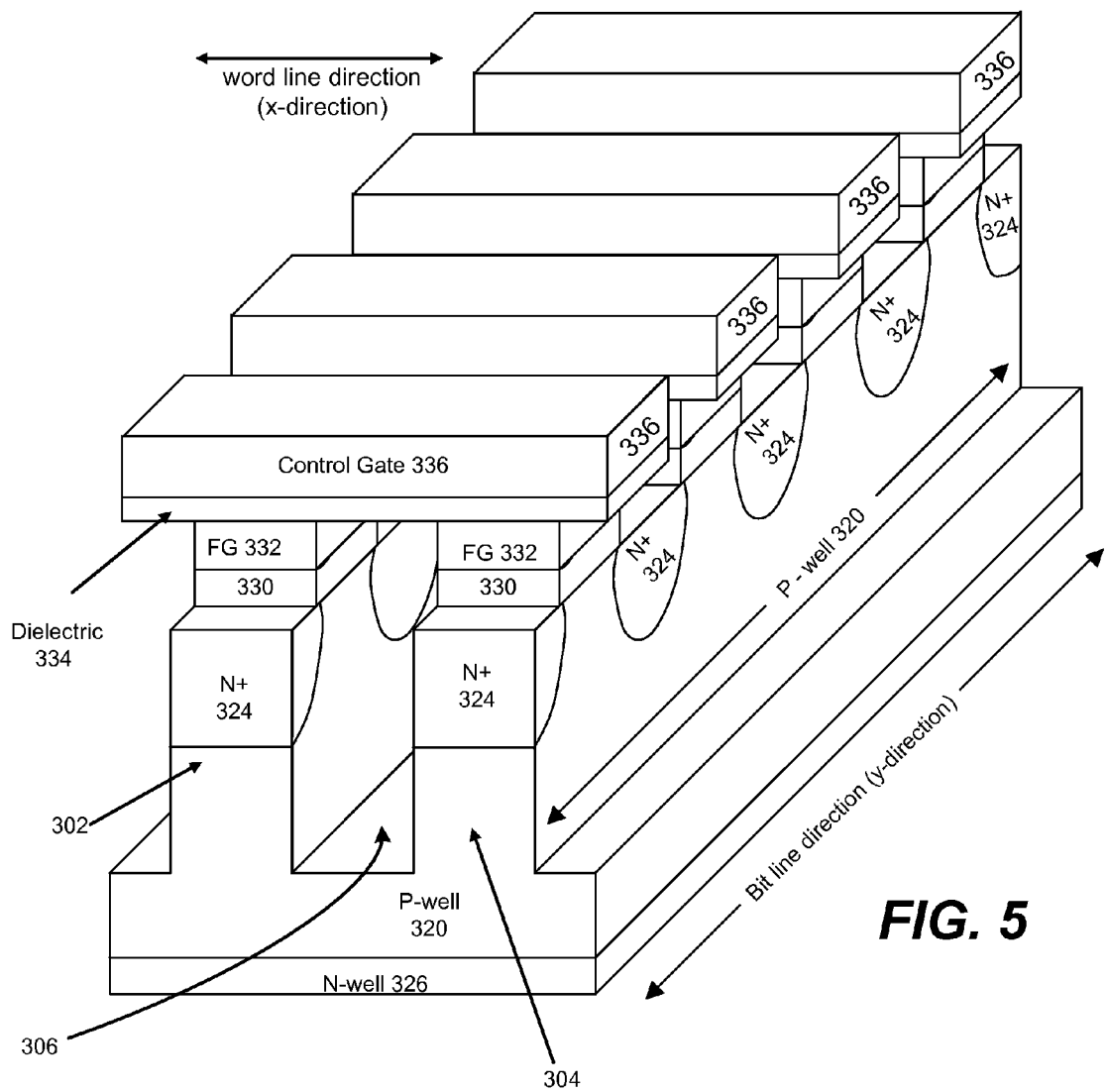
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by an open area or void 306. Typically, an insulating material or dielectric is formed between adjacent NAND strings in this open area.

Figure 6:
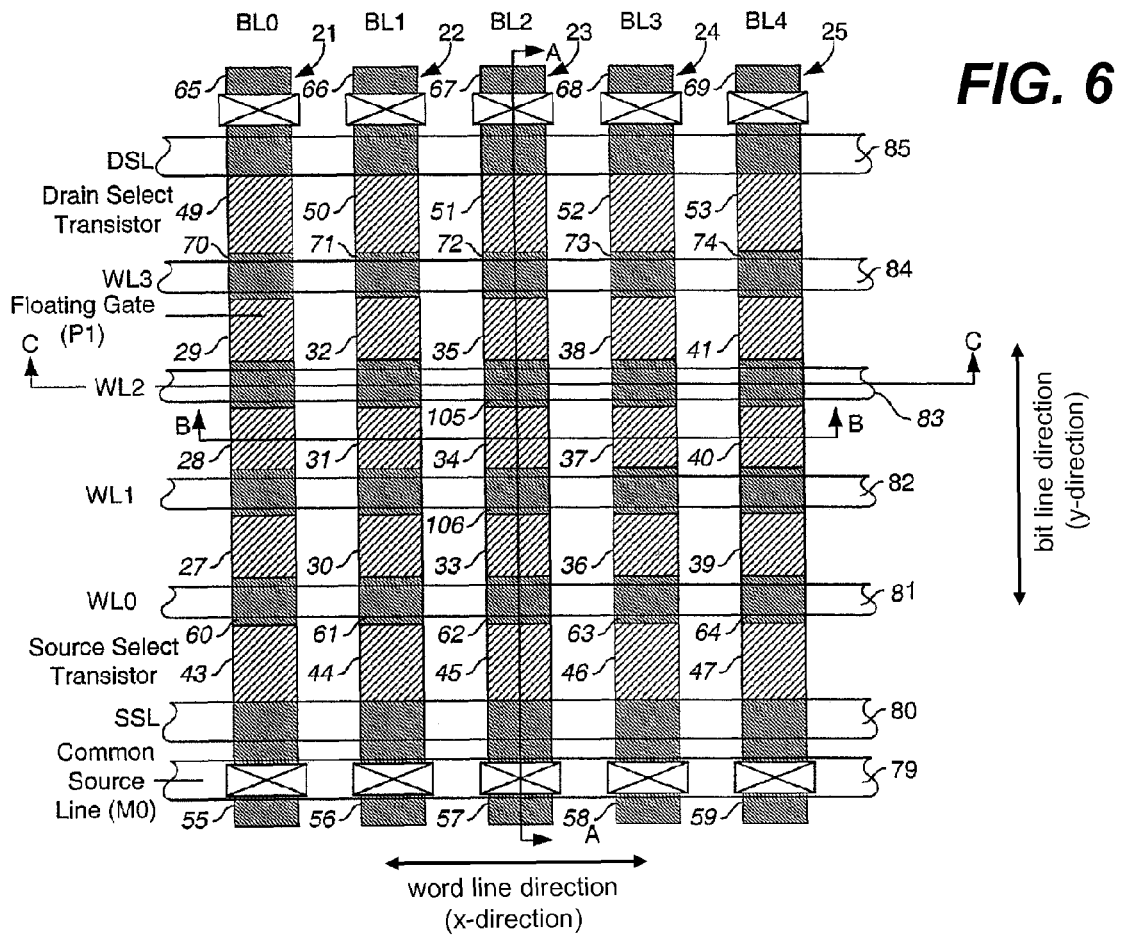
FIG. 6 is a plan view of a portion of a NAND flash memory array having a dual control-gate structure.

A NAND memory array having two control gates per memory cell is illustrated in plan view in FIG. 6. Five NAND strings 21-25 of series connected memory cells are included, with three floating gates or charge storage elements shown in each string. String 21 includes floating gates 27, 28, 29, string 22 includes floating gates 30, 31, 32, string 23 includes floating gates 33, 34, 35, string 24 includes floating gates 36, 37, 38, and string 25 includes floating gates 39, 40, and 41. Only a small rectangular array of fifteen memory cells is illustrated for ease of explanation. Actual implementations of such an array would typically include millions of such memory cells forming thousands of NAND strings, each string normally having 16, 32 or more memory cells.

Each NAND string includes two select transistors, one at each end of the string, to controllably connect the string between a different one of global bit lines BL0-BL4 and a common source line. A voltage is applied to respective source select gates 43-47 to control connection of one end of their respective memory cell strings 21-25 to the common source line. The other ends of the strings 21-25 are connected through respective drain select transistors 49-53 to the respective bit lines BL0-BL4. Column control circuitry applies a voltage to each bit line that is representative of the specific data to be written, or to sense the voltage or current of a corresponding string or memory cell during a read or verify operation. The select transistors include respective source and drain regions 55-64 and 65-74 in a semiconductor substrate.

Control gate (word) lines 81-84 are positioned between the floating gates instead of on top of them as in traditional NAND memory arrays. Each control gate line extends across multiple strings of memory cells and is capacitively coupled through a suitable insulating dielectric, such as multi-layer oxide-nitride-oxide (ONO), to the floating gates on both sides. Additional coupling area is obtained by using the sidewall areas of both sides of the floating gates. The floating gates can be made thicker (higher) than usual in order to increase this coupling area, and the control gates in between them are then made to be at least as thick as the floating gates in order to take advantage of the added coupling area. An advantage is that this coupling area may be controlled largely independent of the coupling area of the floating gates and the substrate, resulting in a desirably high coupling ratio even as the coupling area of the floating gates with the substrate is reduced during decreases in device dimensions. The principles, devices and techniques disclosed hereinafter can be used with traditional NAND architectures having word lines positioned above floating gates, or architectures having word lines between the floating gates as shown in FIG. 6.

Two control gate or word lines replace a single word line of conventional NAND arrays in FIG. 6. For example, the word line that would extend across the row of floating gates 27, 30, 33, 36 and 39 in a conventional array is replaced by two control gate lines 81 and 82 (WL0 and WL1). Similarly, a word line that would normally extend across the row of floating gates 28, 31, 34, 37 and 40 is replaced by two control gate lines 82 and 83 (WL1 and WL2). The control lines 81-84 are elongated in the x-direction across the array and separated in the y-direction by the length of the intervening floating gates and the thicknesses of the dielectric layers between them. Although the size of the memory floating gate is typically made as small as the photolithography allows in both x and y dimensions, the channel length of the select transistors 43-47 and 49-53 (y-dimension) is typically slightly larger than the minimum feature size to ensure it can effectively block all conduction including leakage when the maximum voltage is applied across it.

Figure 7:
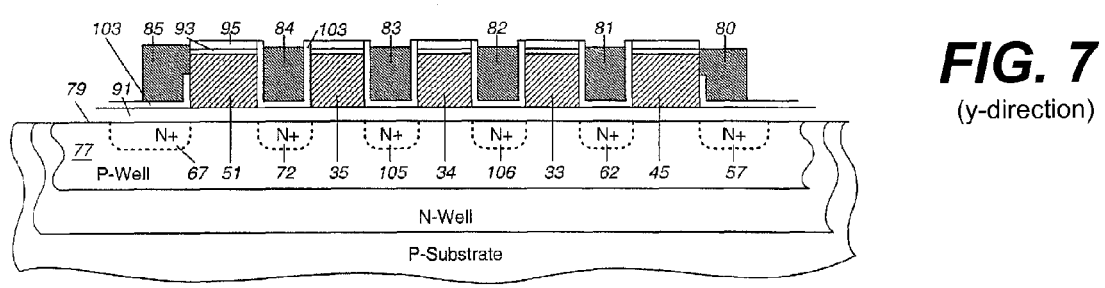
FIG. 7 is an orthogonal cross-sectional view taken along line A—A of the portion of the flash memory array depicted in FIG. 6.
Figure 8:
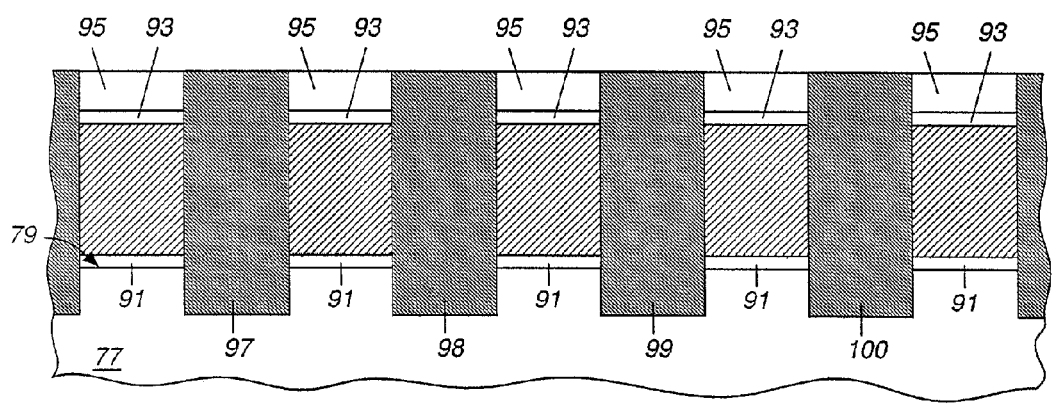
FIG. 8 is an orthogonal cross-sectional view taken along line B—B of the portion of the flash memory array depicted in FIG. 6.
Figure 9:
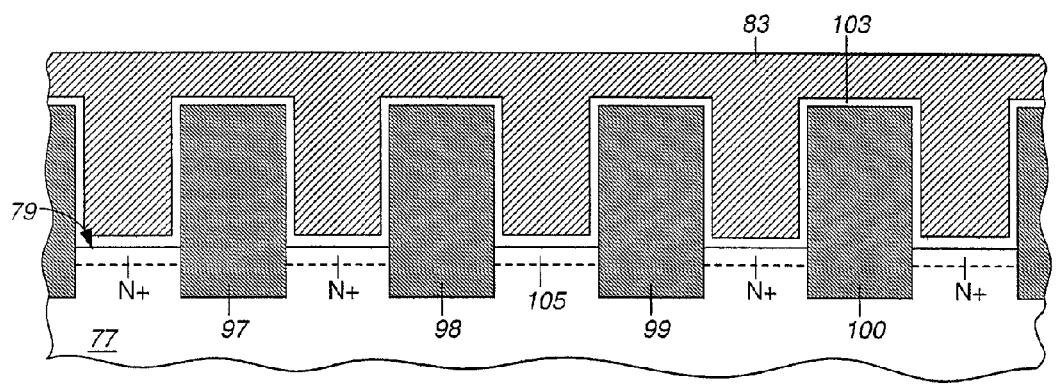
FIG. 9 is an orthogonal cross-sectional view taken along line C—C of the portion of the flash memory array depicted in FIG. 6.

FIG. 7 is an orthogonal cross-sectional view of the array shown in FIG. 6 taken along line A-A in the y-direction through one string of memory cells. FIG. 8 is an orthogonal cross-sectional view of the array taken along line B-B in the x-direction along a row of memory cells extending across multiple strings. FIG. 9 is a cross-sectional view of the array taken along line C-C in the x-direction along a word line. A layer 91 of tunnel dielectric (e.g., silicon oxide, $SiO_2$) is formed on the surface 79 of the substrate 77 to a thickness of about 8 nm. A first layer of the charge storage material (e.g., doped polysilicon) is formed over at least the area of the array from which the floating gates 51, 35, 34, 33 and 45 are formed.

Electrical isolation is provided between columns of floating gates by Shallow Trench Isolation (STI). The exposed substrate surface is anisotropically etched to form trenches 97-100 elongated in the y-direction and positioned between the polysilicon/dielectric stack strips in the x-direction. These trenches are etched to a depth of 100-300 nm in one embodiment. In other embodiments, trench depths of up to 1000 nm, 2000 nm or more can be used.

Additional trenches can be formed alongside the first polysilicon strips with lengths in the x-direction. Over the active regions these trenches extend the full height of the floating gate plus the thickness of masking layers 93 and 95, and over the field regions they will extend 100-200 nm. The control gate lines 81-84, select gate lines 80 and 85, and source and bit line contacts are formed in these trenches. Before forming these control gate lines, ions are implanted in the trenches, shown in the cross-sectional view of FIG. 7 as memory transistor and select gate implanted source and drain regions 67, 72, 105, 106, 62 and 57. A dielectric layer 103 is formed over the exposed surfaces of the structure, conforming to the sidewalls and bottom surfaces of the newly formed trenches. The layer 103 is ONO but may also be a material having a higher dielectric constant.

A second layer of doped polysilicon is deposited over the array area, completely filling the trenches and contacting the dielectric layer 103. This polysilicon is then removed from the top of the structure by CMP, resulting in control gate lines 81-84, the SSL line 80, and the DSL line 85. These lines are made to extend at least as high as the floating gates to which they are capacitively coupled through the dielectric layer 103.

When forming dual control gate structures, it is often desirable to make the length of the floating gate in the column direction as small as possible. The increased coupling ratio due to sidewall coupling allows this floating gate dimension to be decreased without negatively affecting the influence of the control gates over the floating gates. It may also be desirable to decrease the size of the active areas and isolation regions therebetween when the dimensions of the floating gates are being scaled in this manner. In some instances, it may be advantageous to fabricate one or more of these feature sizes of the memory array at less than the minimum resolvable feature size of the photolithography process. Spacer-assisted patterning techniques can be used to achieve dimensions below the minimum resolvable feature size. In some cases, however, traditional spacer-assisted patterning may not achieve as small a dimension as desired or needed. Moreover, some spacer-assisted techniques are not suitable for achieving equal line and space sizes which may also be desired as part of the fabrication process.

Figure 10:
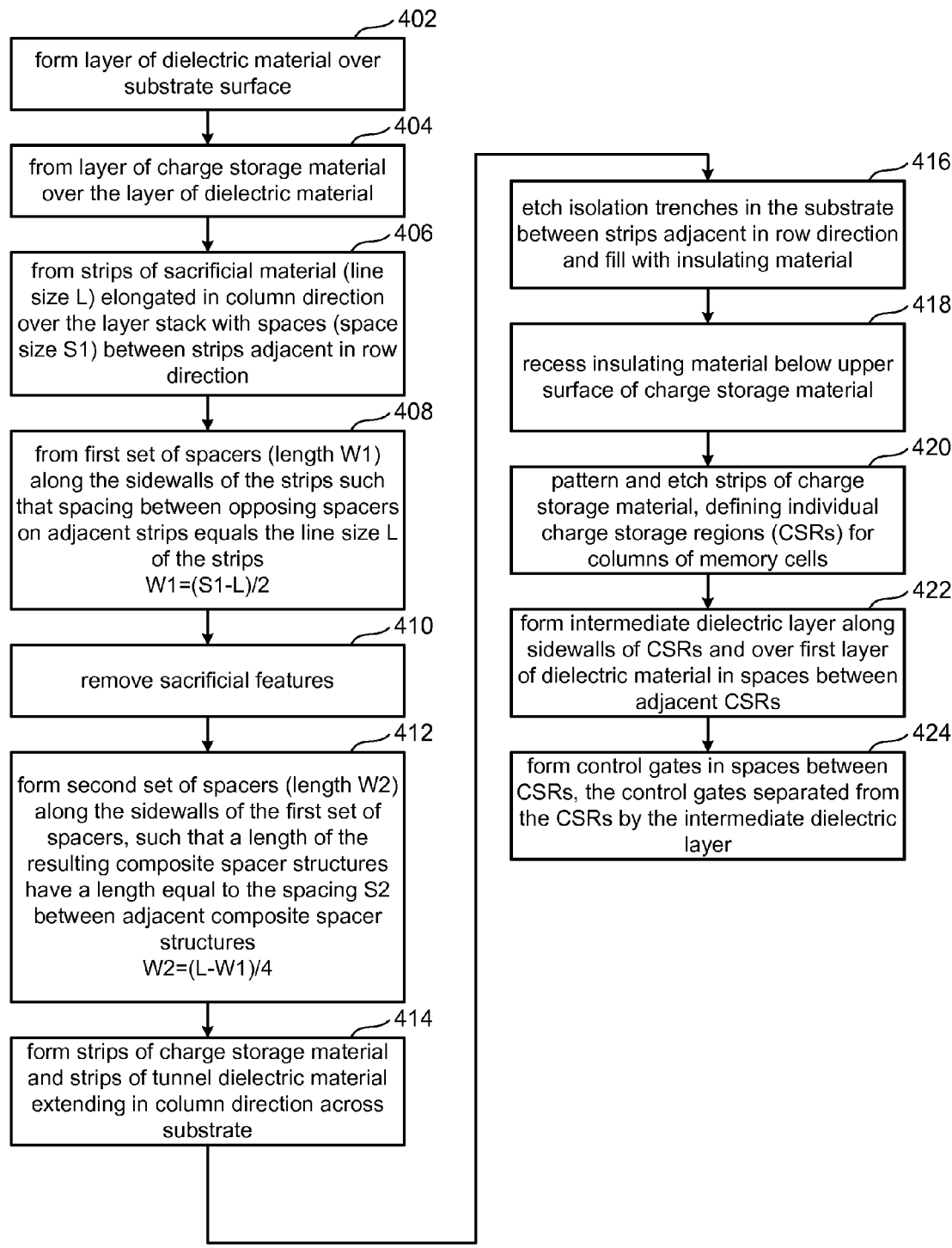
FIG. 10 is a flowchart describing a method of fabricating non-volatile flash memory in accordance with one embodiment.

FIG. 10 is a flowchart describing a method of fabricating a non-volatile memory array in accordance with one embodiment of the presently disclosed technology. A double spacer patterning technique is used to decrease feature sizes during fabrication. In one embodiment, double spacer patterning is used to achieve feature sizes that are below the minimum resolvable feature size of the photolithography process. Additionally, double spacer patterning is used to achieve equal line and space sizes in one embodiment. The line and space sizes can both be less than the minimum resolvable feature size.

At step 402, a layer of dielectric material (e.g., oxide) is formed over the surface of the substrate. This layer of dielectric material forms the tunnel dielectric for the resulting array of memory cells. A layer of charge storage material is formed over the layer of dielectric material at step 404. The charge storage material can include conductive materials such as polysilicon for forming conductive floating gates or dielectric materials for forming dielectric charge storage elements. At step 406, strips of sacrificial material are formed over the layer stack including the dielectric and charge storage layers. The strips include sidewalls that extend in a substantially vertical direction from the surface of the substrate. The strips are elongated in a first (y) direction across the substrate and have a length in a second (x) direction that is defined by the photolithographic process. The y-direction corresponds to the columns of memory cells and the x-direction corresponds to the row or word line direction. Photolithographic patterning can be used to form strips of photoresist over a layer of the sacrificial material. The strips are formed using a lithographically defined line size L with spaces between strips adjacent in the x-direction equal to the space size S1 of the photolithographic process.

At step 408, a first set of spacers are formed along the sidewalls of the strips of sacrificial material. The spacers can be formed of different types of materials, including but not limited to oxides, nitrides and polysilicon. The spacers are formed in one embodiment such that the resulting spacing between spacers on adjacent strips of the sacrificial material is substantially equal to the line size L used when forming the strips of sacrificial material. Equation 1 describes the relationship between the row direction dimensions of the features to achieve a spacing equal to the line size L. The length W1 of the spacers in the row direction is equal to half of the difference between the space size S2 and the line size L. Conformal deposition processes can be used with a target thickness equal to W1.

$$W1 = \frac{S1 - L}{2} \quad \text{Equation 1}$$

The sacrificial features are removed at step 410. Removing the sacrificial features results in equal x-direction spacing between each spacer when the spacer length is defined according to Equation 1. The separation between the spacers will be equal to the line size L used to form the sacrificial features. A second set of spacers is formed at step 412 after removing the strips of sacrificial material. The spacers of the second set are formed along the sidewalls of the first set of spacers, extending vertically with respect to the surface of the substrate and elongated in the column direction along the sidewalls of the first set of spacers. The second set of spacers can be formed of the same material as the first set of spacers or can be formed from a different material. For example, undoped polysilicon is used to form the first and second sets of spacers in one embodiment. In another example, one set of spacers can be formed of nitride and the other formed of oxide or polysilicon. Different combinations can be used in accordance with the disclosed technology.

Forming the second set of spacers on the first set of spacers results in a set of composite spacer structures, each comprised of one spacer from the first set and two spacers from the second set. The spacers of the second set are formed along each sidewall of the first set of spacers. Accordingly, the length of the composite spacer structure will be increased by twice the length of the second set of spacers. Thus, when conformal deposition processes are used, the second spacer material can be deposited with a target thickness equal to half the desired increase in the length of the composite spacer structures. To achieve an equal spacing between each composite spacer structure, the length W2 of the second spacers is selected according to equation 2 in one embodiment.

$$W2 = \frac{L - W1}{4} \quad \text{Equation 2}$$

At step 414, the composite spacer structures are used as a pattern to etch the underlying layer stack, including the charge storage material and dielectric material. The layers are etched to form strips of charge storage material elongated in the y-direction across the surface of the substrate with strips of the dielectric material formed therebetween. In one embodiment where the dimensions are selected according to Equations 1 and 2, the resulting strips are separated by a spacing equal to their length.

At step 416, the substrate is etched using the strips and any remaining spacer material as a mask to form isolation trenches in the substrate. The trenches are elongated in the y-direction between strips of charge storage material adjacent in the x-direction. The isolation trenches are filled with a suitable insulating material such as a silicon dioxide to provide electrical isolation between active areas of the substrate underlying the strips formed from etching at step 414. The composite spacer structures are formed with a combined length in the x-direction that is equal to the spacing between adjacent spacer structures. As a result, the isolation trenches are formed with a length in the x-direction that is substantially equal to the length in the x-direction of the active areas of the substrate. Accordingly, equal line and space sizes are used to define substantially equal sizes for the active areas and isolation regions therebetween.

The insulating material formed in the isolation trenches is recessed below the upper surfaces of the strips of charge storage material at step 418. The insulating material can be selectively etched to below the upper surface of the charge storage layer, facilitating the subsequent formation of control gates that are continuous in the row direction. It is also possible to form explicit interconnections for rows of control gates without recessing the insulating material.

The process of forming individual storage elements from the strips of charge storage material begins at step 420. The strips of charge storage material are patterned and etched to divide each strip along its length in the y-direction. Etching the strips along their length forms a plurality of individual charge storage regions from each strip. Spaces are formed between regions adjacent in the y-direction as a result of etching. Standard photolithographic techniques can be used to define the pattern at step 420 in one embodiment. In other embodiments, spacer-assisted patterning or nano-imprint technologies can be used. Moreover, composite spacer techniques as presently described can be used. These techniques can be beneficial to define the feature size of the charge storage regions in the column direction at less than the minimum resolvable feature size of the photolithographic process. Moreover, these techniques can be beneficial to achieve equal line and space sizes at less than the minimum resolvable feature size. At step 422, the intermediate dielectric layer is formed. The intermediate dielectric layer is formed along the sidewalls of the individual charge storage regions, extending in the y-direction between adjacent charge storage regions. Control gates are formed at step 424. The control gates at least partially occupy the spaces between adjacent charge storage regions. The control gates are separated from the sidewalls of charge storage regions by the intermediate dielectric layer. The control gates are continuous in the row direction, intrinsically forming the word lines for the memory array. A layer of conductive material can be deposited and etched back or polished to form the individual control gates. Because the insulating material is recessed below the upper surface of the charge storage regions, the control gate material can extend continuously in the row direction after deposition and etch back.

Figure 11A:
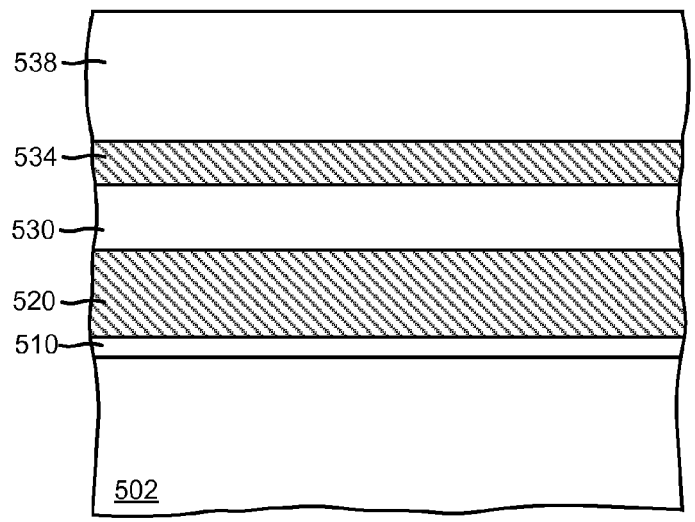
FIGS. 11A-11P are orthogonal cross-sectional views through a portion of a non-volatile memory array fabricated in accordance with one embodiment.
Figure 11B:
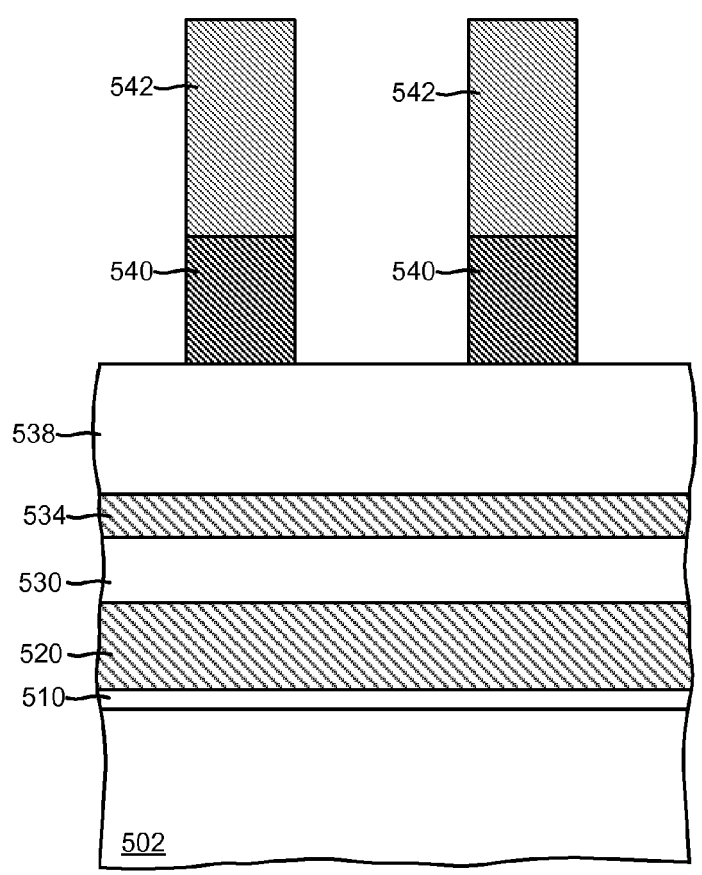
Figure 11C:
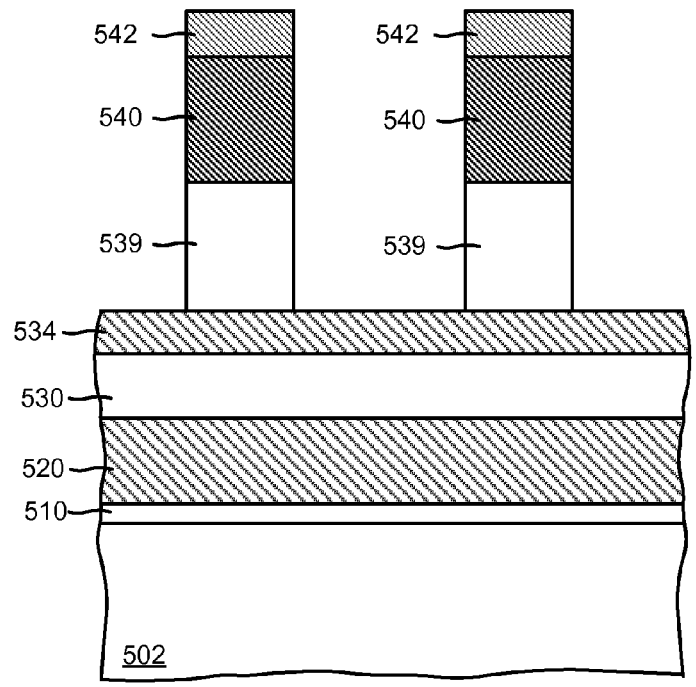
Figure 11D:
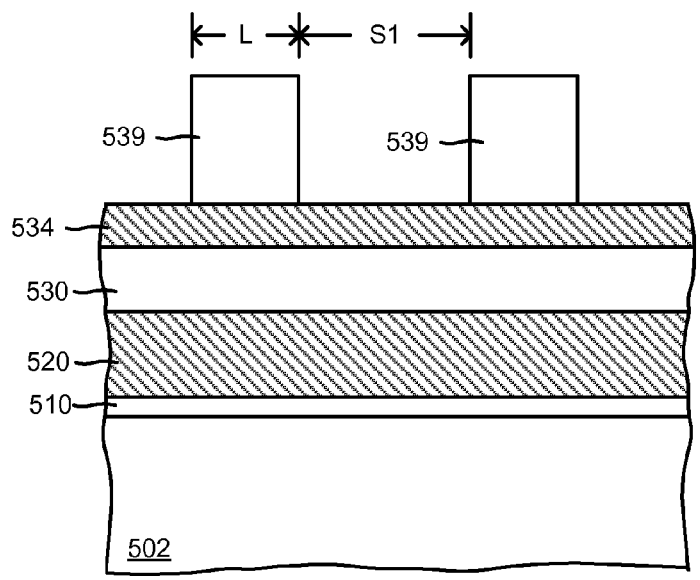
Figure 11E:
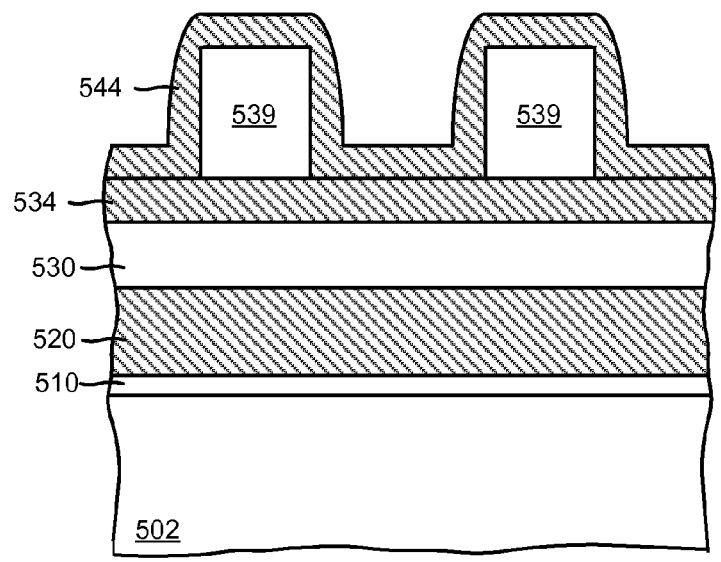
Figure 11F:
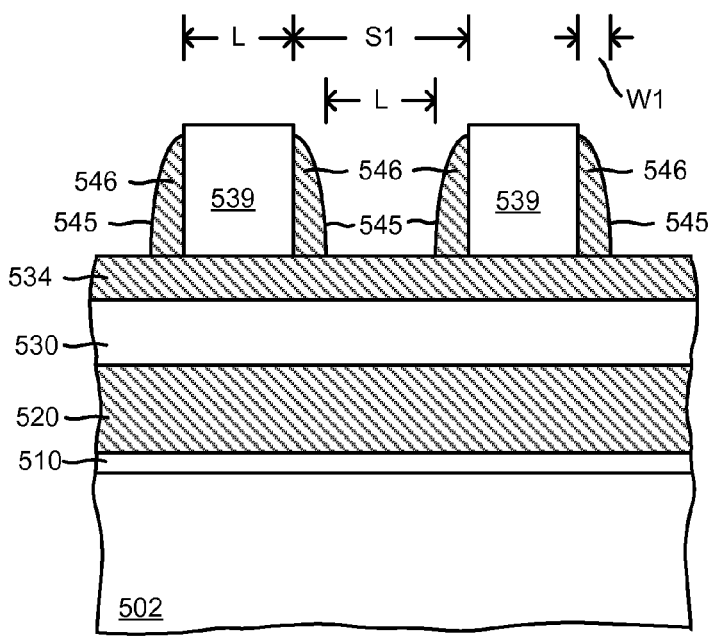
Figure 11G:
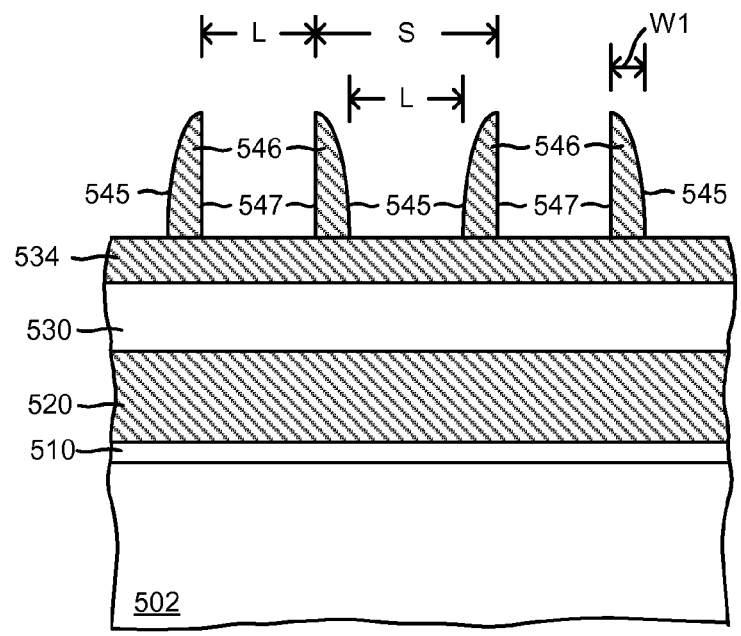
Figure 11H:
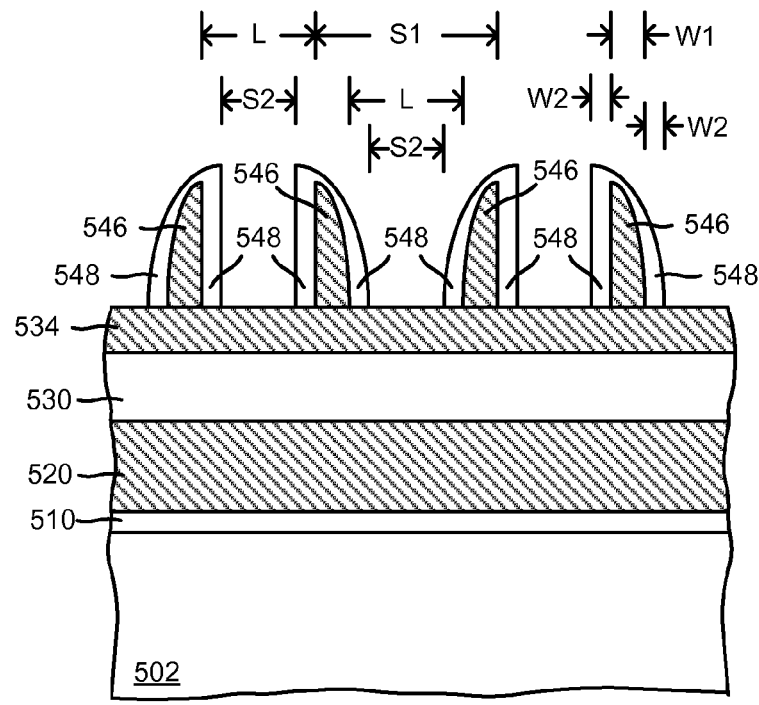
Figure 11I:
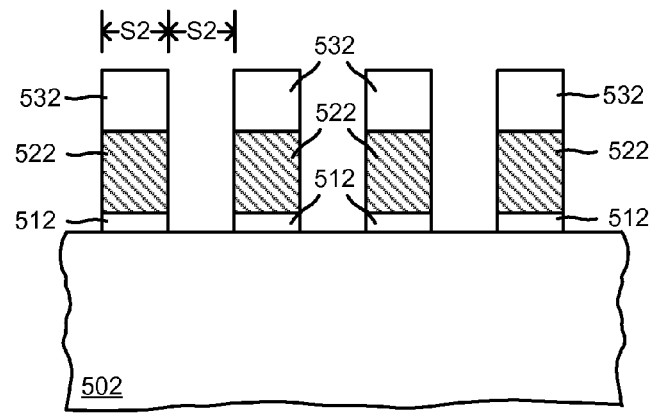
Figure 11J:
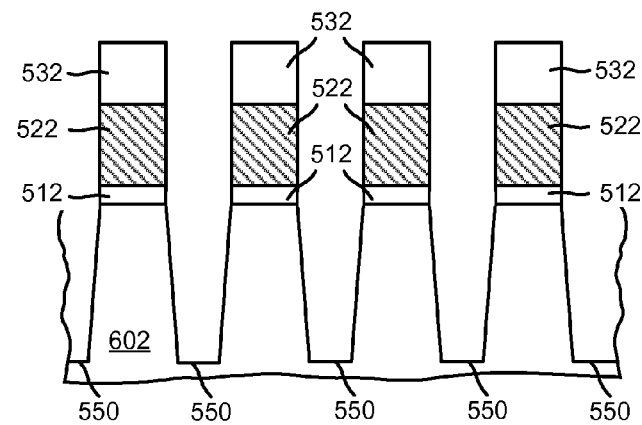
Figure 11K:
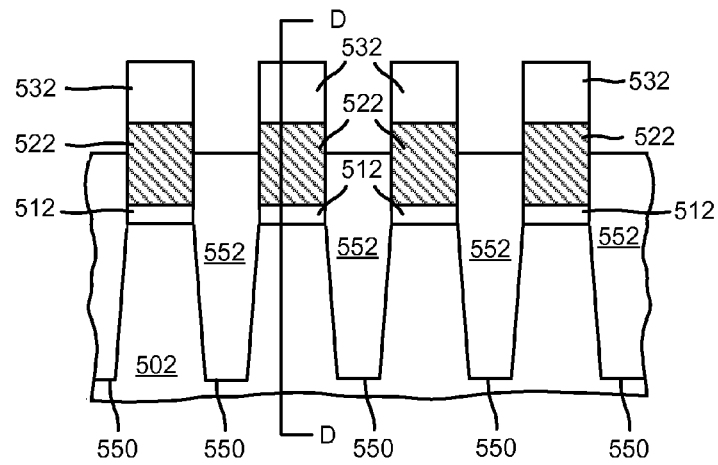
Figure 11L:
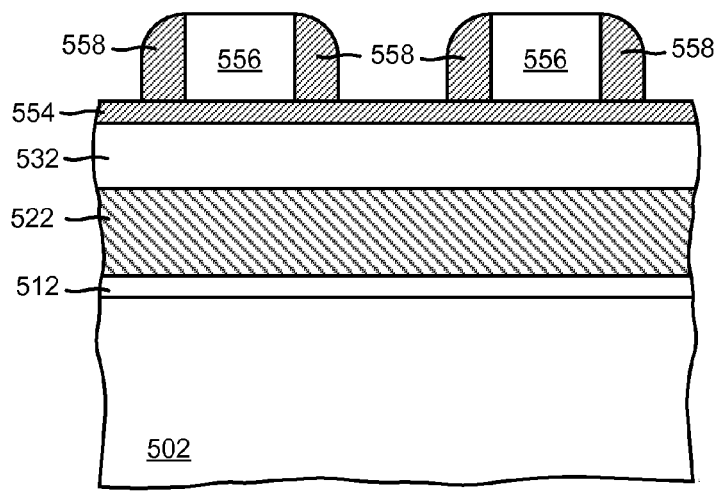
Figure 11M:
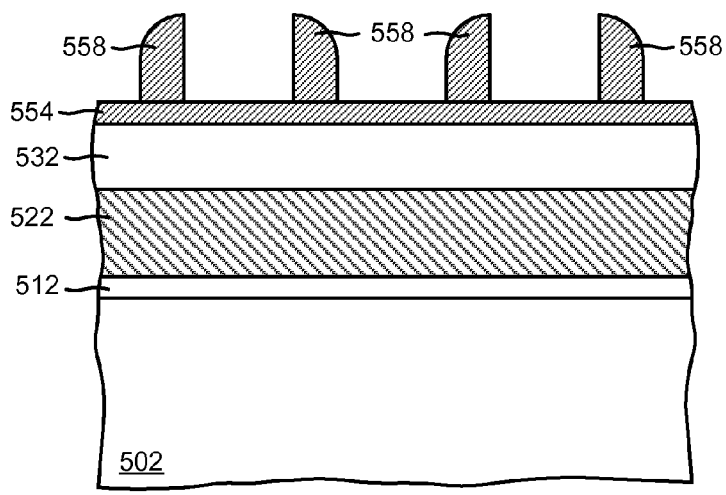
Figure 11N:
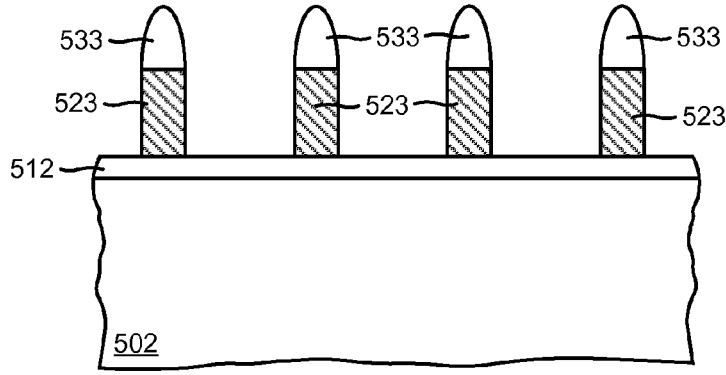
Figure 11O:
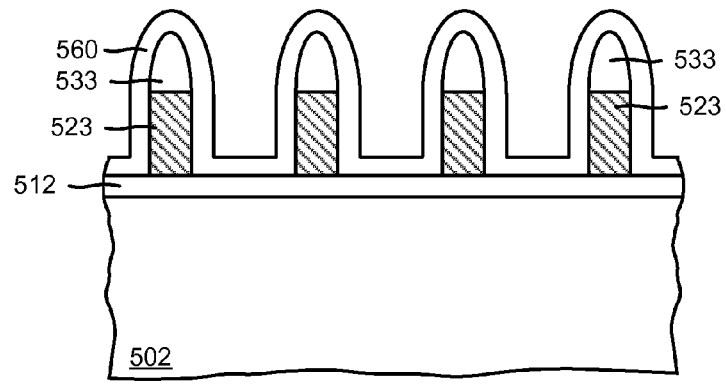
Figure 11P:
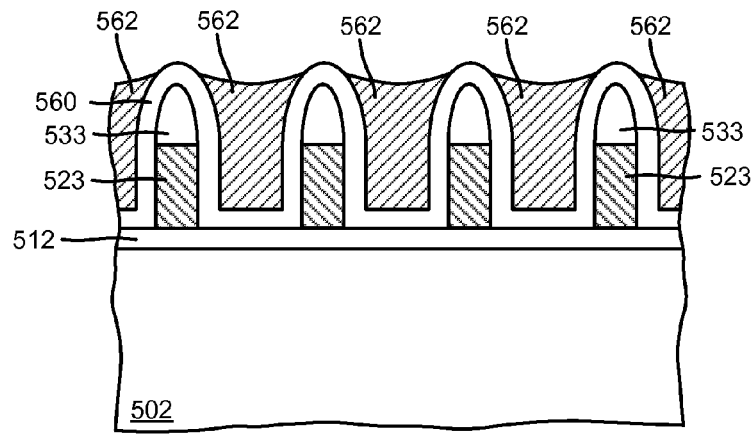

FIGS. 11A-11P are orthogonal cross-sectional views depicting a non-volatile memory array and method of forming the same in accordance with one embodiment of the presently disclosed technology. The described embodiment is exemplary only and should not be taken as limiting the disclosure. The exact materials, dimensions and order of processing may vary according to the requirements of a particular implementation. The described embodiment includes a dual control gate structure for the memory cells, but it will be appreciated that the technology may be used with traditional NAND arrays having a single overlying control gate per memory cell, including those with composite charge storage structures.

Figure 1:
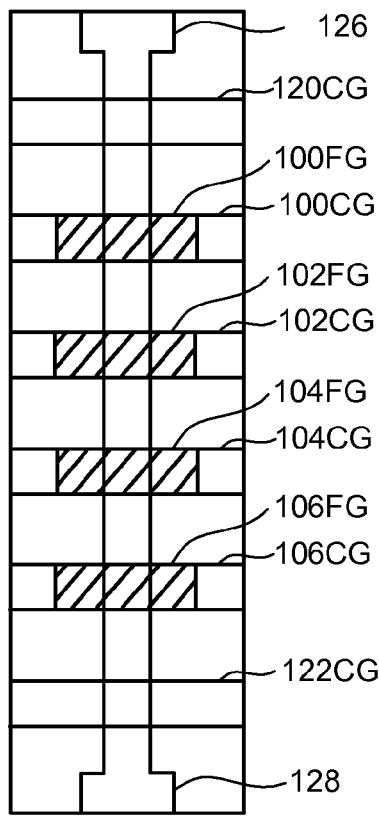
FIG. 1 is a top view of a NAND string.
Figure 2:
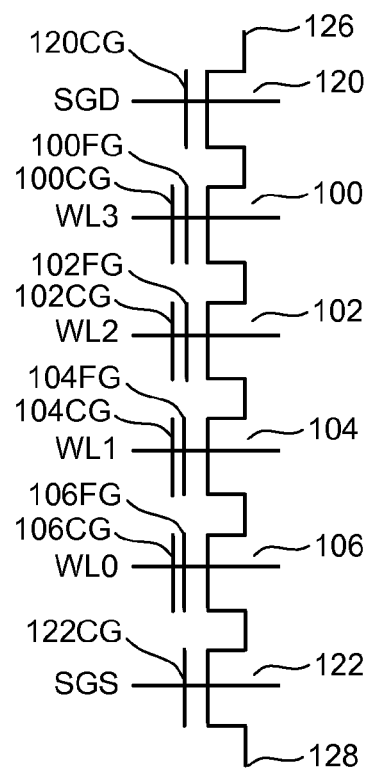
FIG. 2 is an equivalent circuit diagram of the NAND string depicted in FIG. 1.

FIG. 1A is a cross-sectional view taken along a line in the x-direction through a portion of a row of floating gates for the memory array, such as line B-B depicted in FIG. 6. In this embodiment, isolation trenches between active areas adjacent in the row direction are formed prior to defining the gate dimension of the individual charge storage regions. One or more wells (e.g., a triple well), not shown, are typically formed in the substrate 502. The term substrate may include reference to such well regions. After implanting and associated annealing of the well(s) to dope the substrate, a layer 510 of tunnel oxide or other suitable dielectric material is thermally grown over the substrate surface. The oxide can also be deposited using known chemical vapor deposition (CVD) processes, metal organic CVD processes, physical vapor deposition (PVD) processes, atomic layer deposition (ALD) processes, grown using a thermal oxidation process, or formed using other suitable processes. A zero layer formation step including the formation of a pad oxide layer for example, may precede formation of the tunnel dielectric layer in some embodiments.

A layer 520 of polysilicon or other charge storage material is formed over the tunnel oxide 510. It is noted that a layer may still be said to be over another layer when one or more interleaving layers are between the two layers, as well as when the two layers are in direct contact. In one embodiment, doped polysilicon is formed by low-pressure chemical vapor deposition (LPCVD), although other processes can be used. Different thicknesses of the charge storage layer can be used, for example, between about 5 nm and 200 nm in one embodiment. This thickness is greater than that of some NAND memories, with the result that the floating gates are thicker than those of some traditional devices. A layer 530 of hard mask material is formed over the polysilicon. The hard mask can include different materials such as a layer of high temperature oxide (HTO). In one embodiment, the hard mask includes a thin pad of silicon dioxide over which is formed a layer of silicon nitride ($Si_3N_4$). An optional assist layer 534 used for subsequent spacer formation process is formed over the hard mask layer. In the described example, polysilicon is used to match the spacer material but different materials can be used. Finally, a layer 538 of sacrificial material is formed over the assist layer. Various materials can be used for the sacrificial layer, including but not limited to various oxides and nitrides.

Strips of photoresist 542 are patterned over the layer of sacrificial material using conventional photolithography techniques as shown in FIG. 11B. The strips 542 of photoresist are patterned over strips 540 of a bottom anti-reflective coating (BARC). The strips of photoresist are elongated in the column direction across the surface of the substrate with spaces therebetween. In one embodiment, the line size L used in patterning the photoresist is equal to the minimum resolvable feature size of the photolithographic process being used. Unequal line and space sizes are used such that the space size S1 between adjacent strips of photoresist is greater than the line size L.

The sacrificial layer 538 is etched using the pattern of photoresist strips 542 as a mask to form a set of sacrificial features 539 depicted in FIG. 11C. The sacrificial layer 538 is etched using a suitable process until the optional assist layer 534 is reached. In one embodiment, selective etching is used to etch the sacrificial layer with respect to the assist layer. For example, chemical selective etching can be used to etch a layer of sacrificial nitride or oxide with respect to a polysilicon assist layer to reliably control the etch process without damaging the underlying hard mask. After etching the sacrificial layer, the photoresist and BARC are removed as depicted in FIG. 11D. The sacrificial features are elongated in the column direction across the substrate and have a length in the row direction corresponding to the line size L used in patterning the photoresist. The spacing between adjacent features corresponds to the space size S1 used in patterning the photoresist. The sidewalls of the sacrificial features extend in a direction that is substantially vertical with respect to the surface of the substrate.

The formation of a first set of spacers begins by depositing a first layer 544 of spacer material as depicted in FIG. 11E. The layer is formed over the upper surfaces and along the sidewalls of the sacrificial features. The spacer layer extends over the assist layer between opposing sidewalls of sacrificial features adjacent in the row direction. The layer of spacer material is etched back as shown in FIG. 11F to form a first set of spacers 546 along the sidewalls of each sacrificial feature.

The spacers each have a sidewall 545 with a slope as it approaches the adjoining sacrificial feature.

The first set of spacers is formed with a length W1 in the row direction such that a resulting space between spacers formed on adjacent strips of sacrificial material is substantially equal to the length of the strips in the row direction. To achieve an equal line and space size, the target length W1 of the spacers is half the difference in the line size L and space size S1 of the photolithography process used to form the photoresist strips. A conformal deposition process is used in forming the spacers in one embodiment such that a thickness of the layer of spacer material in the vertical direction is substantially equal to the length of the spacers in the row direction. The conformal process can include a target thickness equal to the selected length of the spacers.

After the first set of spacers is formed, the sacrificial features are removed as depicted in FIG. 11G. Removing the strips of sacrificial material exposes a second sidewall 547 of each spacer in the first set that was previously in contact with the sidewall of the sacrificial strip. An equal spacing exists between each spacer of the first set after removing the strips. More specifically, a substantially constant spacing equal to line size L is formed between each adjacent spacers. The spacers themselves have a length W1 in the row direction that is substantially less than the size of the spaces therebetween.

The assist layer 534 serves a number of functions in the spacer-formation process. First, the assist layer can provide an etch stop for forming the sacrificial features and the wet etch process used to strip the sacrificial features. The assist layer can also provide a stable base for the subsequently formed spacers. For example, the material composition of the assist layer 534 is chosen to provide adequate adhesion for the thinly formed spacers. A matched material composition for the spacers and assist layer facilitates adhesion between the spacers and the underlying layer. For example, the assist layer and spacer material are both polysilicon in one embodiment to improve the stability of the spacers when the sacrificial features are removed. Similar materials that are not exactly the same may also be used to improve adhesion of the spacers to their base layer. Using similar materials for the spacers and intervening layer can also help with stresses between the different films. If layers of different materials are used, the different materials may have different coefficients of thermal expansion causing stress at the interface of the different materials. When the same or similar materials are used, matching thermal coefficients can decrease stresses at the material interfaces. More details regarding the use of an assist layer 534 can be found in U.S. patent application Ser. No. 11/623, 314, entitled "Method Of Forming Spacer Patterns Using Assist Layer for High Density Semiconductor Devices," by Pham, et al., filed Jan. 15, 2007.

With the first set of spacers formed, processing continues to increase the length of the spacer structures and decrease the spacing therebetween. In one embodiment, this processing creates a pattern with equal line and spacing over the layer stack. As depicted in FIG. 11H, a second set of spacers 548 is formed along the exposed sidewalls of the first set of spacers, forming composite spacer structures formed from the first and second sets of spacers. A layer of polysilicon or other suitable material is deposited over the substrate and etched back from the horizontal surfaces to form the spacers. The second set of spacers increases the effective length of the first set of spacers in the row direction and also decreases the spacing therebetween. The second set includes two spacers for each spacer of the first set. The spacers of the second set are formed along both sidewalls of the corresponding first spacer. In FIG. 11H, the second spacers are formed continuously over and along both sidewalls of a corresponding first spacer, with the two spacers of the second set meeting at a position above the corresponding first spacer. It is also possible to etch back the second layer of spacer material from the upper surface of the first spacers such that the two spacers of the second set do not meet. In either case, the second set of spacers increases the effective length of the first set of spacers in the row direction by twice the length of the second spacers in the row direction. Conformal deposition is used to deposit the spacer material in one embodiment. The target thickness of the deposited spacer material can be set to half the desired increase in row direction length of the composite spacer structures.

To achieve equal line and spacing for the composite spacer structures and the separation therebetween, the thickness of the deposition process used in forming the second set of spacers is chosen according to equation 2 described above. The target thickness is set to the desired length of the second spacers in the row direction. The total length of each composite spacer structures is equal to the sum of the length W1 of the first spacers and twice the length W2 of the second spacers. The spacing S2 between the structures is the same as the total length and can be expressed as the difference between the original line size L and twice the length W2 of the second set of spacers. Solving these two equations, the length W2 of the second spacers is equal to one fourth of the difference between the original line size L and the length W1 of the first set of spacers.

By way of non-limiting example, consider a photolithographic process having a minimum resolvable feature size of 38 nm. Strips of sacrificial material with a 38 nm line size (corresponding to the length in the row direction) and a 62 nm spacing between adjacent strips can be formed. A conformal deposition process can then be used to form the first set of spacers having a length W1 equal to about 12 nm. This will form spaces between spacers of adjacent strips equal to the 38 nm line size. Removing the features results in a 38 nm space between each 12 nm spacer. The second set of spacers can then be formed with a length W2 equal to about 6.5 nm. The resulting length of each composite spacer structure is equal to about 25 nm. The spacing between the composite spacer structures is also equal to about 25 nm.

The layer stack is etched using the composite spacer structures as a pattern or mask. Strips are formed from the layer of charge storage material and the layer of tunnel dielectric material as shown in FIG. 11I. Various options exist for etching the layer stack using the composite spacer structures as a mask. A combinational etch process can be used in one embodiment, beginning with a chemically non-selective etch to remove the portions of assist layer 534 and oxide pad layer 530 between the spacer structures. The non-selective etch will remove all or a portion of the polysilicon spacer structures. After etching the oxide pad layer, etching that is selective for polysilicon can be used to etch through the doped polysilicon charge storage layer using the oxide pad layer as a mask. The selective etch will remove any remaining portions of the polysilicon spacers and assist layer. The tunnel oxide dielectric layer can then be etched using selective or non-selective etching. As shown in FIG. 11I, strips 522 of the charge storage material are elongated in the column direction with spaces between strips adjacent in the row direction. Strips 512 of the tunnel dielectric layer are elongated in the column direction between the strips of charge storage material and the surface of the substrate. The resulting strips have a length S2 in the row direction equal to the spacing S2 between the strips.

Strips 532 of the oxide layer are elongated in the column direction over the strips of charge storage material. These oxide strips provide a mask for etching the substrate to form isolation trenches 550 elongated in the column direction between strips adjacent in the row direction. FIG. 11J depicts the array after forming the isolation trenches. A selective anisotropic RIE can be used to etch the silicon substrate to a depth of 100 nm-300 nm in one embodiment. This depth is exemplary only and may vary in different embodiments.

An insulating material 552 such as silicon dioxide is deposited to fill the trenches as depicted in FIG. 11K. The insulating material is polished to about the level of the upper surface of the strips 532 of the hard mask layer. Selective oxide etching is then performed to recess the insulating material below the upper surfaces of the strips 522 of the charge storage layer. The trench isolating material is recessed so that the subsequently formed control gates can extend continuously over the substrate in the row direction, without breaks at the isolation trenches. In other embodiments, the insulating material is not recessed and the control gates are connected by interconnects formed at the backend of the process.

After forming active areas extending in the column direction, a series of processes are performed to define memory cells from the individual columns or strips of the layer stack. FIG. 11L is an orthogonal cross-sectional view taken along line D-D of FIG. 11K. The sectional view shows one column or active area of the memory array depicted in FIG. 11K after forming the isolation trenches. A strip 522 of polysilicon overlies a strip 512 of the tunnel oxide, with a strip 532 of the hard mask layer overlying the strip of polysilicon. FIG. 11L also depicts the array after forming an optional assist layer 554 and sacrificial features 556. The sacrificial features can be formed by patterning strips of photoresist extending in the row direction over an oxide or other sacrificial layer and then anisotropically etching to form a set of sacrificial features that extend across the substrate in the row direction with spacing therebetween in the column direction. Polysilicon pacers 558 are formed along the sidewalls of the sacrificial features. Conformal processes can be used to deposit a layer of polysilicon which is etched back to form the spacers. Non-conformal processes can also be used. After forming the spacers, the sacrificial features are removed using a chemical wet etch to strip the oxide material, resulting in spacers with spaces therebetween in the column direction as depicted in FIG. 11M.

After stripping the sacrificial features, the spacers are used as a mask for etching the underlying layers as depicted in FIG. 11N. Chemical non-selective reactive ion etching is first used to etch through the assist layer and hard mask. After reaching the polysilicon, selective etching is used to etch the polysilicon until reaching the tunnel dielectric layer. Etching the strips of polysilicon divides them along their length in the column direction, thereby forming an array of isolated floating gates 523 or other charge storage regions. The length of the spacers in the column direction defines the gate lengths of the resulting floating gates. Etching the strips 532 of the hard mask layer results in individual hard masks 533 formed over the upper surface of each floating gate 523.

An intermediate layer 560 of dielectric material is then formed as shown in FIG. 11O. The intermediate dielectric layer is triple-layered ONO in one embodiment, but other materials can also be used. Conformal processes can provide a substantially constant thickness of the intermediate dielectric relative to the upper surface and sidewalls of the floating gates. The intermediate dielectric layer is formed over the second layer of dielectric material between adjacent floating gates and also along the exposed portions of the floating gate sidewalls. The intermediate dielectric layer only partially occupies the spaces between floating gates, leaving remaining spaces therebetween.

A layer of polysilicon or other conductive material is then deposited over the array and etched back to form the control gates 562 depicted in FIG. 11P. The control gates fill or substantially fill the area between adjacent portions of the intermediate ONO layer. The polysilicon layer is formed along the substantially vertical sidewalls of the intermediate ONO. The control gates are continuous in the row direction as a result of recessing the insulating material in the isolation trenches.

The resulting control gates are separated from the sidewalls of the adjacent floating gates by the intermediate dielectric layer, having a thickness defined by the depth of the corresponding deposition process if a conformal process is used. The control gates are separated from the surface of the substrate by the intermediate dielectric layer and the tunnel dielectric layer.

The control gates intrinsically form the word lines of the array in the embodiment depicted in FIGS. 11A-11P, although additional interconnections or supplementations can be made to reduce series resistance, for example. The periphery circuits and transistors are formed after completing the array. The array is covered with a dielectric insulation layer and one or more layers of standard via/metallization (e.g., aluminum or copper interconnects) follows to provide electrical access to all bit lines, source lines, word lines and access transistors. These metallization layers can be used as local or global interconnects to reduce the resistivity of word lines that may become exceedingly narrow and therefore highly resistive across large memory arrays.

In the embodiments described with respect to FIGS. 10 and 11A-11P, electrical isolation between adjacent active areas elongated in the column direction is provided prior to etching the layer of floating gate material to define the dimensions of the gate regions in the column direction. A pattern for etching and dividing the floating gate material along its length in the row direction to form strips elongated in the column direction is provided before a pattern for etching the strips along their length to form individual floating gates. It is also possible to apply the double spacer technique to form electrical isolation between adjacent active areas after etching the layer of floating gate material along its length in the column direction to define the gate dimensions. In this embodiment, a pattern for etching the floating gate material along its length in the column direction is provided before a pattern for etching along the length in the row direction to form columns of memory cells.

Figure 12:
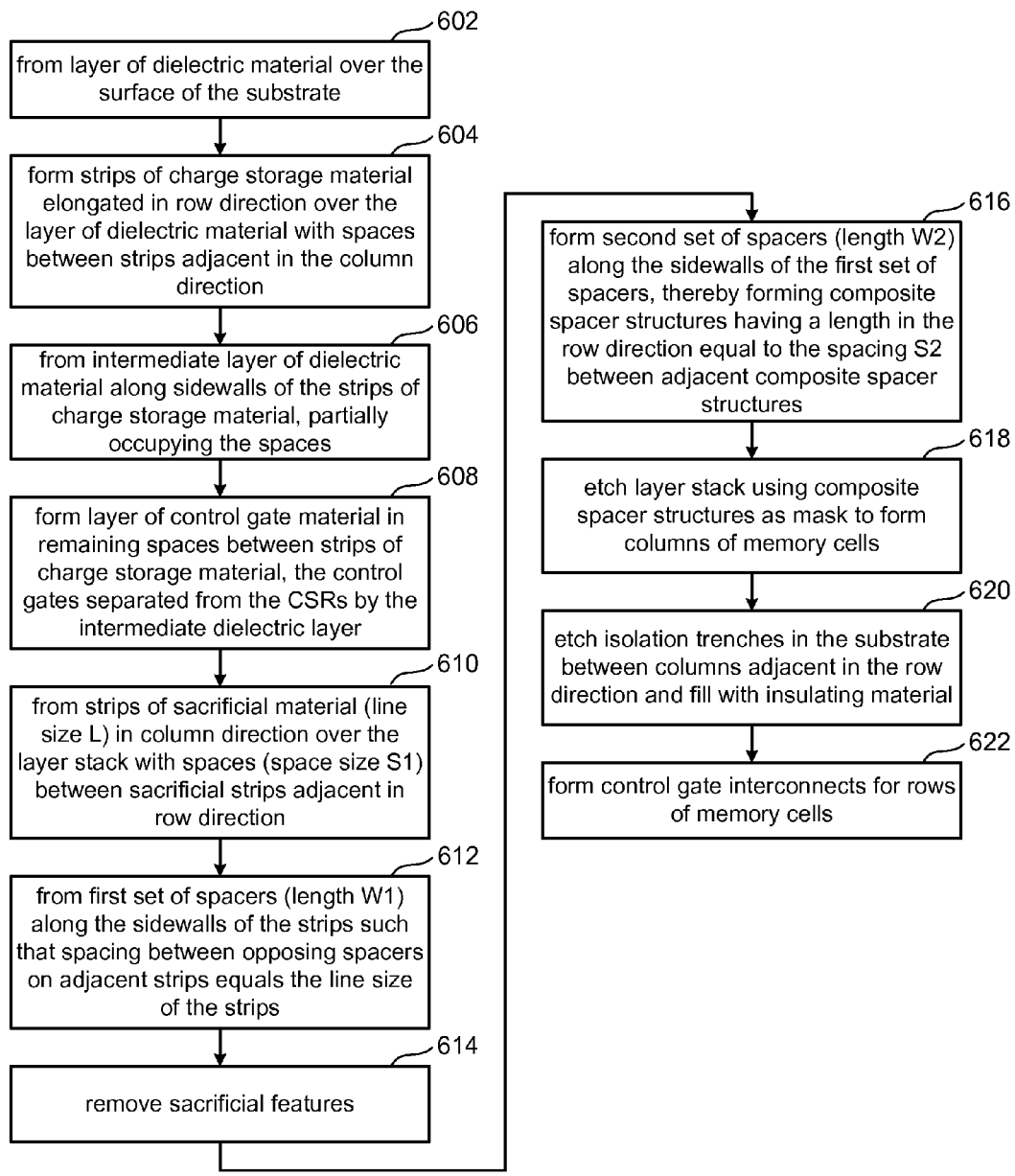
FIG. 12 is a flowchart describing a method of fabricating non-volatile flash memory in accordance with one embodiment.

FIG. 12 is a flowchart describing a method of fabricating a non-volatile memory array in an embodiment that provides electrical isolation between adjacent active areas using a double spacer formation process after forming the floating gate dimension in the column direction. A layer of dielectric material is provided over the surface of the substrate at step 602. At step 604, strips of charge storage material elongated in the row direction over the layer of dielectric material are formed with spaces between strips adjacent in the column direction. Step 604 can include depositing a layer of polysilicon and then patterning and etching the polysilicon to form the strips. The strips include substantially vertical sidewalls elongated in the row direction. At step 606, an intermediate layer of dielectric material is formed at least along the sidewalls of the strips. A hard mask may be formed over the charge storage layer prior to etching such that the intermediate dielectric layer extends continuously over the upper surface of the hard mask and along the sidewalls. After forming the intermediate dielectric layer, the control gates are formed at step 608. A layer of polysilicon is deposited in the spaces between adjacent strips of charge storage material in one embodiment. This layer can be etched back or polished to form individual strips of the polysilicon elongated in the row direction between adjacent strips of charge storage material. The strips of polysilicon are separated from the strips of charge storage material by the intermediate dielectric layer.

The process continues by forming columns of memory cells and active areas of the substrate with electrical isolation therebetween. At step 610, strips of sacrificial material elongated in the column direction are formed over the layer stack. The strips include sidewalls that extend substantially vertically from the surface of the substrate. The strips are formed using a lithographically defined line size L with spaces between strips adjacent in the row direction equal to the space size S1 of the photolithographic process. At step 612, the first set of spacers are formed along the sidewalls of the strips of sacrificial material. As before, the spacers can be formed in one embodiment according to Equation 1 such that the resulting spacing between spacers on adjacent strips of the sacrificial material is substantially equal to the line size L used when forming the strips of sacrificial material. The sacrificial features are removed at step 614. Removing the sacrificial features results in an equal row direction spacing between each spacer when the length of the first set of spacers is selected according to Equation 1. The separation between the spacers is equal to the line size used to form the sacrificial features.

A second set of spacers is formed at step 616 after removing the strips of sacrificial material. The spacers of the second set are formed along the sidewalls of the first set of spacers, extending vertically with respect to the surface of the substrate and elongated in the column direction along the sidewalls of the first set of spacers. The composite spacer structures are formed, each comprised of one spacer from the first set and two spacers from the second set. To achieve an equal spacing between each composite spacer structure, the length W2 of the second spacers is selected according to equation 2 in one embodiment.

At step 618, the composite spacer structures are used as a pattern to etch the underlying layer stack, including the charge storage material, the dielectric material and the control gates. The layers are etched to form columns including strips of charge storage material elongated in the column direction across the surface of the substrate with strips of the dielectric material formed therebetween. In one embodiment, the resulting strips are separated in the row direction by a spacing that is equal to the length of the strips in the row direction when the dimensions are selected as described above.

At step 620, the substrate is etched using the strips and any remaining spacer material as a mask to form isolation trenches in the substrate elongated in the column direction between strips of charge storage material adjacent in the row direction. The isolation trenches are filled with a suitable insulating material at step 620. Etching the layer stack and substrate to form isolated active areas after patterning and etching the control gates divides the control gates along their length in the row direction, forming individual control gates discontinuous in the row direction. At step 622, interconnects are formed for rows of control gates to provide continuity along which common signals can be applied to rows of control gates. The interconnections form the word lines for the array of memory cells.

Figure 13A:
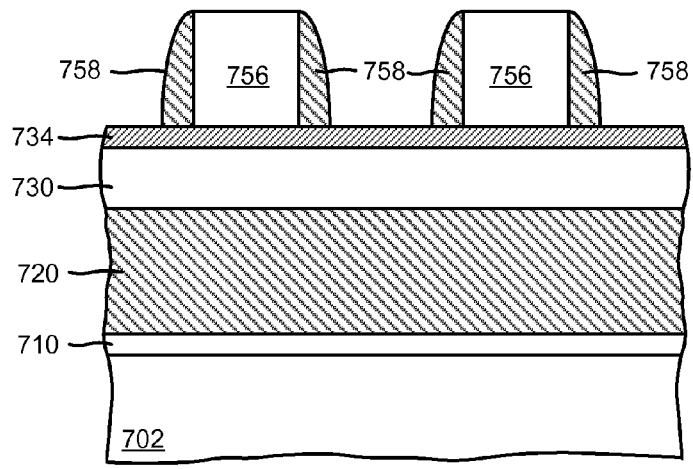
FIGS. 13A-13L are orthogonal cross-sectional views through a portion of a non-volatile memory array fabricated in accordance with one embodiment.
Figure 13B:
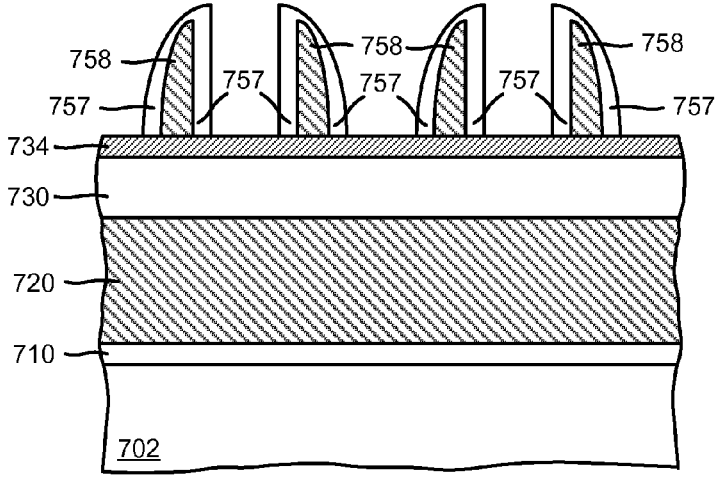

FIGS. 13A-13L are orthogonal cross-sectional views depicting the fabrication of a non-volatile memory array in accordance with an embodiment that provides electrical isolation after forming that floating gate dimension. In addition, this embodiment includes the use of a double spacer patterning to form the floating gate dimension in the column direction. FIG. 13A depicts substrate 702 after forming tunnel dielectric layer 710, a layer 720 of charge storage material (e.g. polysilicon), a hard mask or pad layer 730 and an optional assist layer 734. Additionally, a set of strips 756 of sacrificial material are formed over the assist layer, elongated in the row direction across the substrate. A first set of spacers 758 has been formed along the sidewalls of the strips.

The sacrificial strips are removed after forming the spacers, e.g., by applying a chemical wet etch selective to the sacrificial material. A selective etch process can be tailored to etch sacrificial strips made of nitride for example, such that the etch process will stop upon reaching the underlying assist layer, which may be formed of polysilicon. After removing the sacrificial strips, a second set of spacers 757 is formed along the exposed sidewalls of the first set of spacers. Composite spacer structures are formed, each including one spacer from the first set and two spacers from the second set. In the depicted embodiment, the lengths of the first and second sets of spacers are selected so that the composite spacer structures have a length in the column direction that is equal to the spacing between the composite spacer structures. Other dimensions can also be used.

Figure 13C:
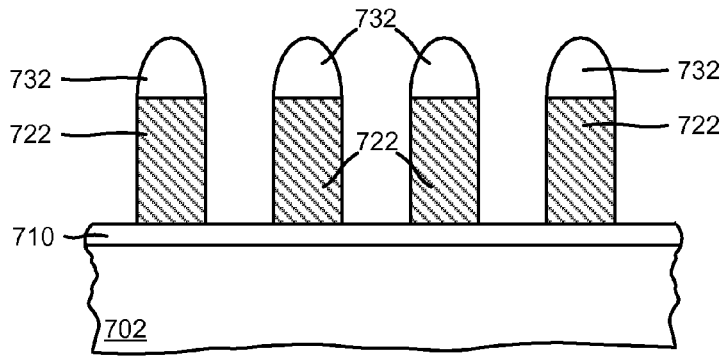

After forming the composite spacer structures, one or more etch processes are applied to etch the underlying layer stack using the spacers as a pattern. Etching stops at the layer of tunnel dielectric material. The result of etching is shown in FIG. 13C, with strips 722 of polysilicon elongated in the row direction with spaces between strips adjacent in the column direction. Strips 732 of the pad layer are elongated in the row direction over the upper surface of the strips of polysilicon.

Figure 13D:
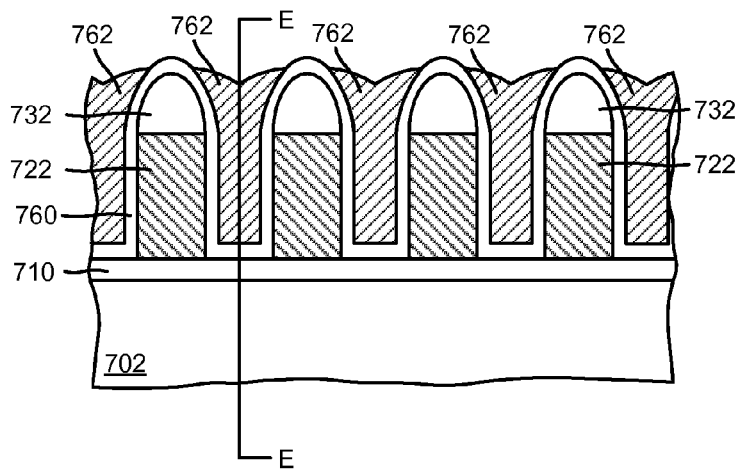
Figure 13E:
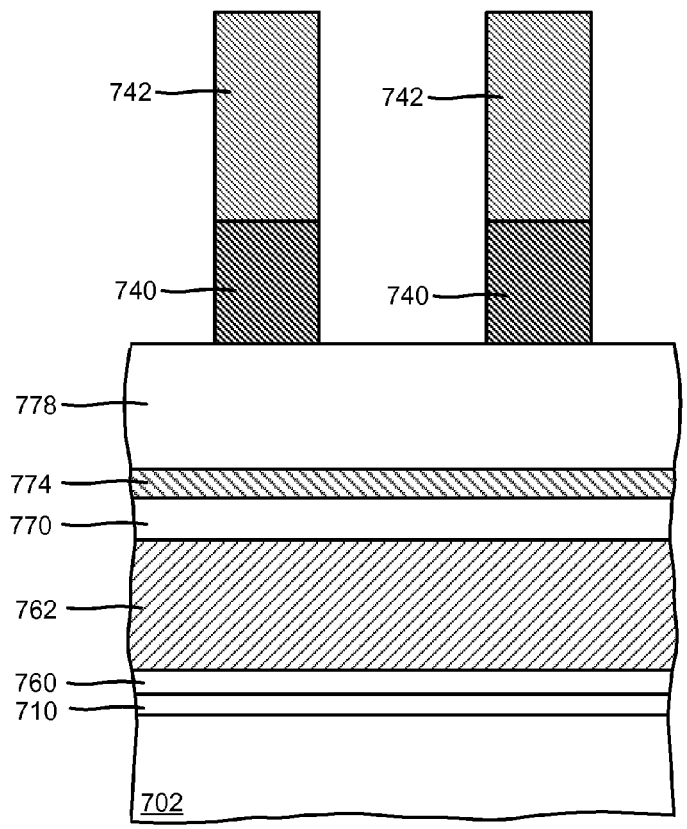

An intermediate layer 760 of dielectric material is formed as depicted in FIG. 13D. Control gates 762 are formed between strips adjacent in the column direction. The control gates are separated from the sidewalls of the strips by the intermediate dielectric layer. Next, the layer stack is patterned and etched into strips elongated in the column direction with spaces therebetween. FIG. 13E is an orthogonal cross-sectional view taken through line E-E of FIG. 13D in the row direction along a control gate. The substrate is depicted, over which has been formed the tunnel oxide 710, the intermediate dielectric 760 and the control gate layer 762. FIG. 13E also depicts the formation of hard mask or pad layer 770, optional assist layer 774, and sacrificial layer 778. Additionally, strips 742 of photoresist with underlying strips 742 of a BARC are elongated in the column direction with spaces therebetween.

Figure 13F:
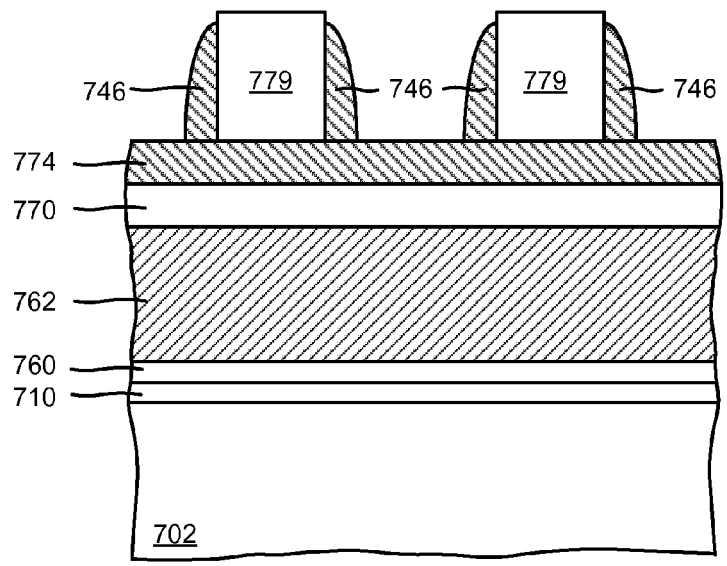

Using the photoresist as a mask, the sacrificial layer 778 is etched to form a plurality of sacrificial features 779 as depicted in FIG. 13F. The photoresist is then removed and a first layer of spacer material depicted and etched back to form the first set of spacers 746. The spacers are formed along the sidewalls of each sacrificial feature. As earlier described, the first set of spacers can be formed with a length W1 in the row direction such that a resulting space between spacers formed on adjacent strips of sacrificial material is substantially equal to the length of the strips in the row direction. The length can be determined according to Equation 1 to achieve equal sizes.

Figure 13G:
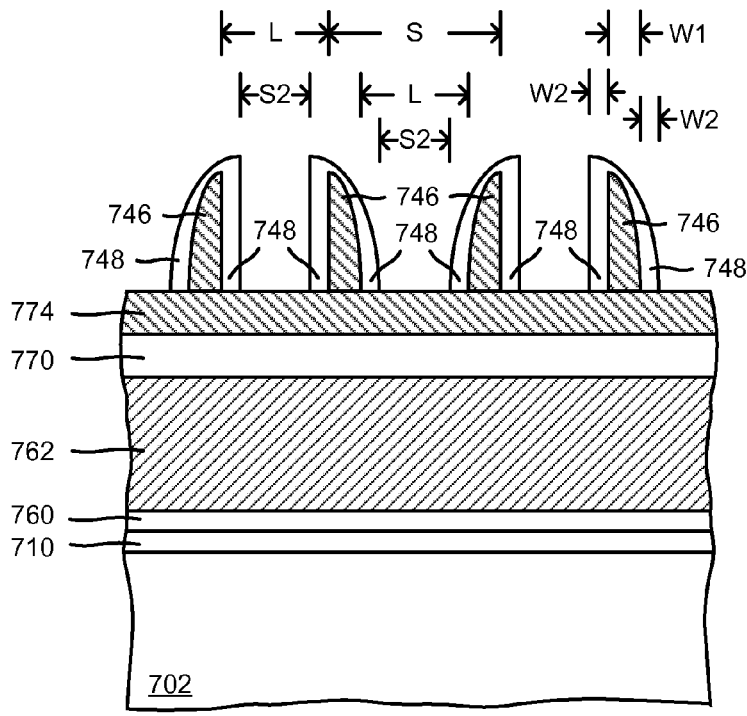

After the first set of spacers is formed, the sacrificial features are removed as depicted in FIG. 13G. An equal spacing L exists between each spacer of the first set after removing the strips when the length of the spacers is selected according to Equation 1. A second set of spacers 748 is formed along the exposed sidewalls of the first set of spacers as also shown in FIG. 13G. The second set of spacers increases the effective length of the first set of spacers in the row direction and also decreases the spacing between the spacers. The second set of spacers includes two spacers for each spacer of the first set. The spacers of the second set are formed along both sidewalls of the corresponding first spacer. The target thickness of the deposited spacer material can be set to half the desired increase in row direction length of the composite spacer structures. To achieve equal line and spacing for the composite spacer structures and the separation therebetween in one embodiment, the thickness of the deposition process used in forming the second set of spacers is chosen according to equation 2 described above. The result is an equal spacing S2 between each composite spacer structure.

Figure 13H:
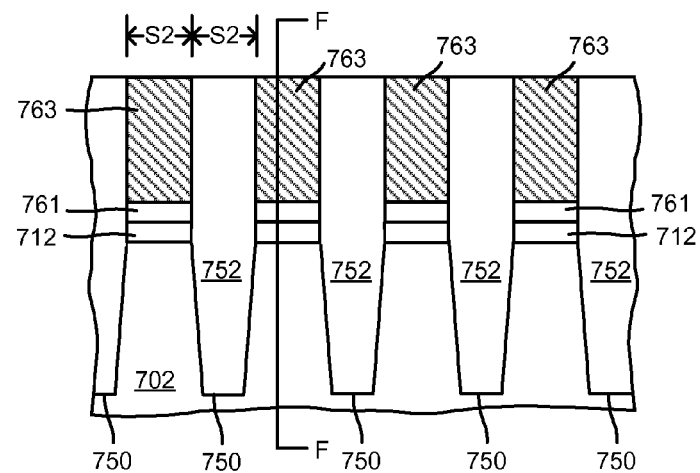

The layer stack is etched using the composite spacer structures as a pattern or mask to etch strips from the layer stack as shown in FIG. 13H. Etching divides the control gates along their length in the row direction, forming individual control gates 763 that are discontinuous in the row direction. Etching also divides the intermediate dielectric layer 760 and tunnel dielectric layer 710 into strips 761 and 712, respectively. Using the strips as a mask (including strips of the pad layer 770 not shown), the substrate is etched to form isolation trenches 750. An insulating material 752 such as silicon dioxide is deposited to fill the trenches. The insulating material is polished to about the level of the upper surface of the strips 732 of the hard mask layer.

Figure 13I:
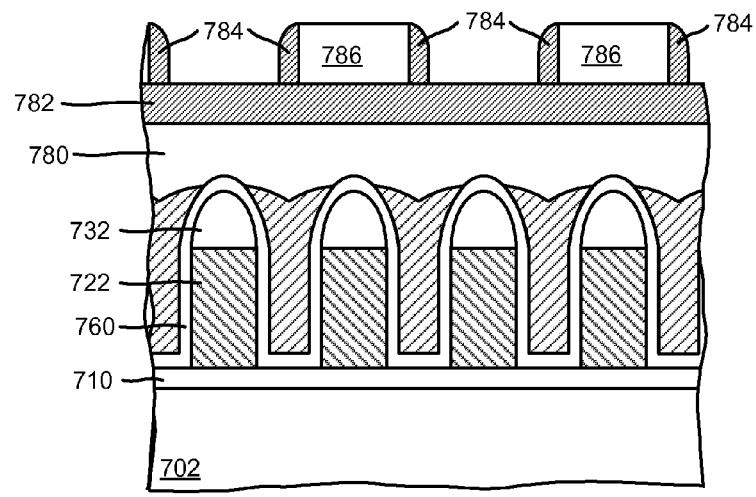

Since the control gates are already divided along their length in the row direction, a recessing step is not performed as interconnections will be provided between control gates in the row direction. Rows of individual control gates can be interconnected to explicitly form word lines for providing common operating voltages to a row of memory cells. FIG. 13I is an orthogonal cross-sectional view taken along line F-F of FIG. 13H after planarizing the isolation oxide. An oxide hard masking layer 780, e.g. TEOS oxide, is formed over the substrate. An optional assist layer 782 (e.g., polysilicon) is formed over the masking layer, followed by a sacrificial layer of nitride which is patterned using photoresist to form a plurality of sacrificial features 786 elongated in the row direction with spaces therebetween in the column direction. A sacrificial layer of polysilicon is deposited and etched back to form spacers 784 along the sidewalls of the sacrificial features. The sacrificial features are removed using reactive ion etching after forming the spacers.

Figure 13J:
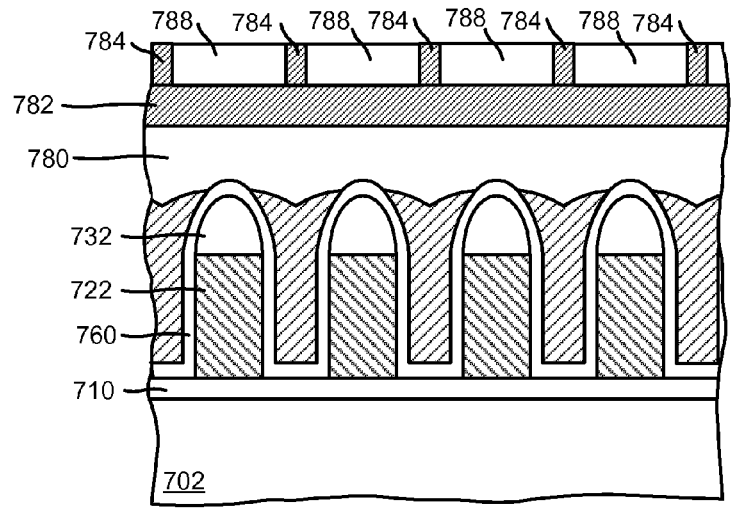
Figure 13K:
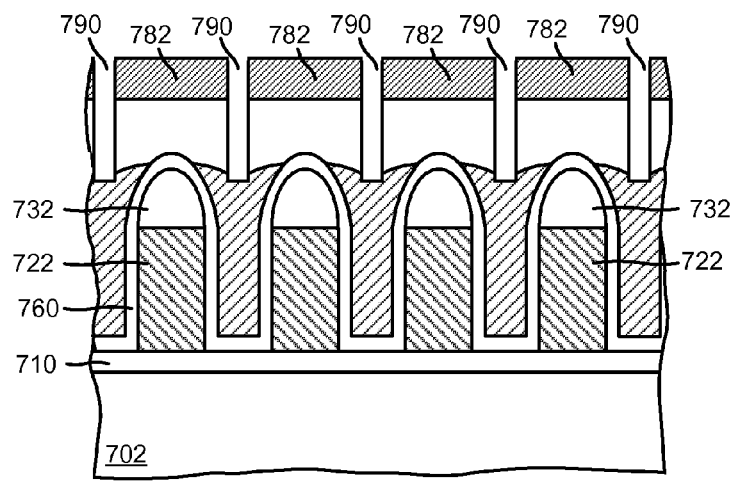
Figure 13L:
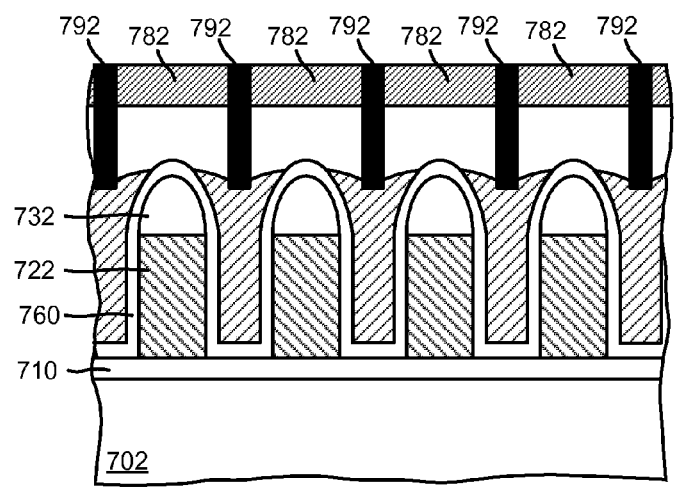

A layer 788 of insulating material such as another TEOS oxide is then deposited in the spaces between spacers as shown in FIG. 13J. The oxide is planarized to a uniform height with the spacers. After planarizing the surface, etching selective to polysilicon is used to remove the remaining spacer material and underlying assist layer. The etch chemistry is then changed to selectively etch the oxide layer with respect to the polysilicon assist layer until reaching the polysilicon control gates, resulting in the structure depicted in FIG. 13K. Etching forms trenches 790 in the insulating layer to at least the upper surface of the control gates. The trenches are elongated in the in the row direction and are filled with a conductive material 792 to interconnect rows of individual control gates. FIG. 13L depicts the memory array after forming the interconnects and removing the assist layer. The control gate interconnections form the word lines for the array.

Figure 14:
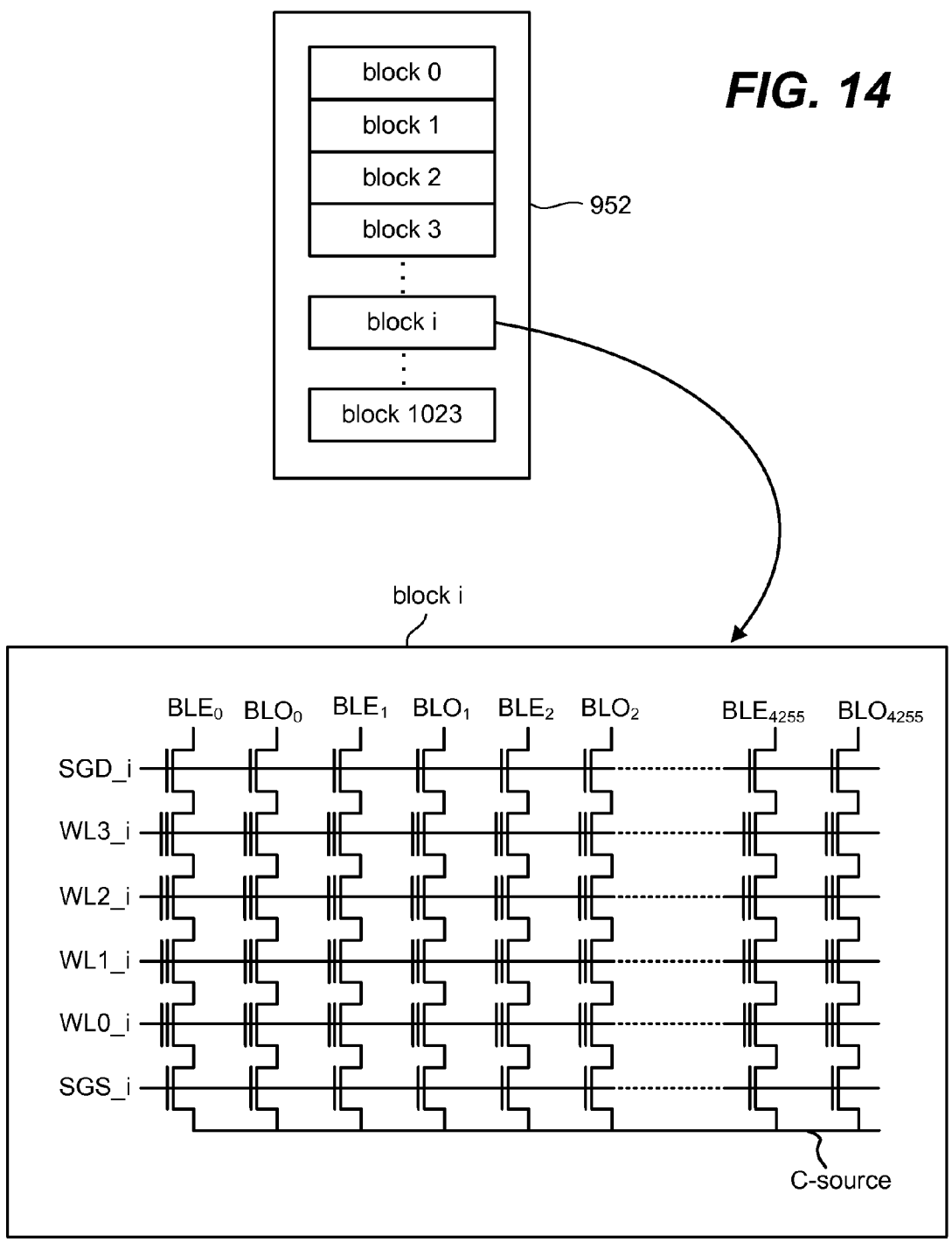
FIG. 14 depicts an exemplary organization of a memory array in accordance with one embodiment.

FIG. 14 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 14 shows four memory cells connected in series to form a NAND string.

Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 15:
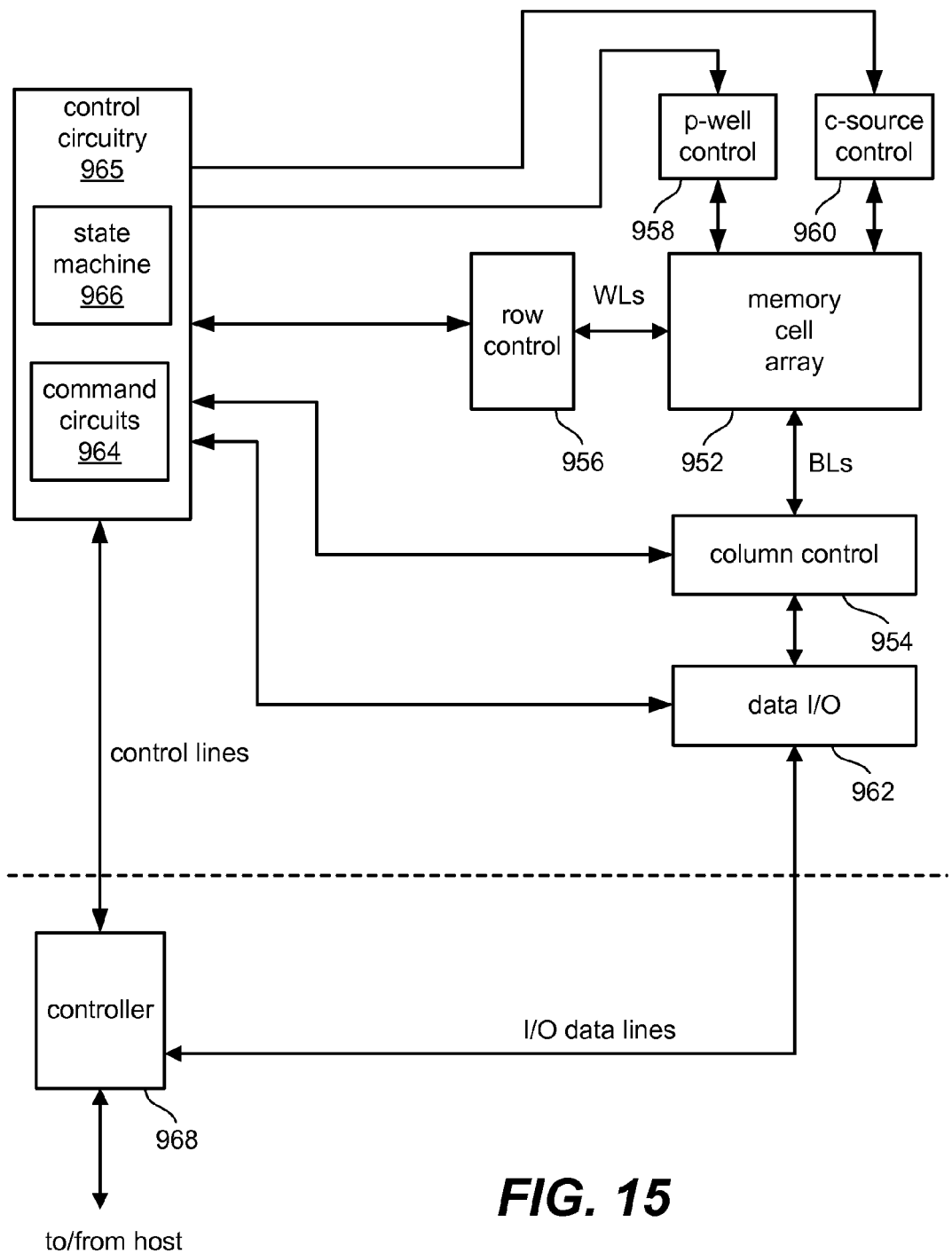
FIG. 15 is a block diagram of an exemplary memory system that can be used to implement embodiments of the disclosed technology.

FIG. 15 is a block diagram of one embodiment of a flash memory system that can be used to implement one or more embodiments of the present disclosure. Other systems and implementations can also be used. Memory cell array 952 is controlled by column control circuit 954, row control circuit 956, c-source control circuit 960 and p-well control circuit 958. Column control circuit 954 is connected to the bit lines of memory cell array 952 for reading data stored in the memory cells, for determining a state of the memory cells during a program operation, and for controlling potential levels of the bit lines to promote or inhibit programming and erasing. Row control circuit 956 is connected to the word lines to select one of the word lines, to apply read voltages, to apply program voltages combined with the bit line potential levels controlled by column control circuit 954, and to apply an erase voltage. C-source control circuit 960 controls a common source line connected to the memory cells. P-well control circuit 958 controls the p-well voltage.

The data stored in the memory cells are read out by the column control circuit 904 and are output to external I/O lines via data input/output buffer 962. Program data to be stored in the memory cells are input to the data input/output buffer 962 via the external I/O lines, and transferred to the column control circuit 954. The external I/O lines are connected to controller 968.

Command data for controlling the flash memory device is input to controller 968. The command data informs the flash memory of what operation is requested. The input command is transferred to state machine 966 which is part of control circuitry 965. State machine 966 controls column control circuit 954, row control circuit 956, c-source control 960, p-well control circuit 958 and data input/output buffer 962. State machine 966 can also output status data of the flash memory such as READY/BUSY or PASS/FAIL.

Controller 968 is connected to or connectable with a host system such as a personal computer, a digital camera, or personal digital assistant, etc. It communicates with the host that initiates commands, such as to store or read data to or from the memory array 952, and provides or receives such data. Controller 968 converts such commands into command signals that can be interpreted and executed by command circuits 964 which are part of control circuitry 965. Command circuits 964 are in communication with state machine 966. Controller 968 typically contains buffer memory for the user data being written to or read from the memory array.

One exemplary memory system comprises one integrated circuit that includes controller 968, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Various features and techniques are presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method performed as part of making non-volatile memory using a semiconductor substrate, comprising:
    forming a first layer of dielectric material over a surface of the substrate;
    forming a first layer of charge storage material over the first layer of dielectric material;
    etching to divide the first layer of charge storage material along its length in a first direction, thereby forming first strips of the first layer of charge storage material elongated in a second direction with spaces between first strips adjacent in the first direction, the first strips including sidewalls extending in the second direction across the substrate, the first direction being substantially perpendicular to the second direction;
    forming an intermediate layer of dielectric material along the sidewalls of the first strips of the first layer of charge storage material extending in the second direction;
    forming a first set of strips of conductive material elongated in the second direction and at least partially occupying the spaces in the first direction between the first strips of charge storage material, the first set of strips of conductive material being separated from the first strips of the first layer of charge storage material by the intermediate layer of dielectric material;
    forming a first set of strips of sacrificial material elongated in the first direction over the surface of the substrate with at least the first layer of dielectric material and the first layer of charge storage material therebetween, the first set of strips of sacrificial material having sidewalls extending in the first direction and separated in the second direction with spaces between opposing sidewalls of adjacent strips, wherein forming the first set of strips of sacrificial material is performed after etching to divide the first layer of charge storage material along its length in the first direction, forming the intermediate layer of dielectric material and forming the first set of strips of conductive material;
    forming a first set of spacers elongated in the first direction along the sidewalls of the first set of strips of sacrificial material;
    removing the first set of strips of sacrificial material such that the first set of spacers have exposed first and second sidewalls elongated in the first direction;
    forming a second set of spacers elongated in the first direction along the first and second sidewalls of the first set of spacers and separated in the second direction with spaces therebetween;
    etching the first layer of charge storage material and the first layer of dielectric material using the first set of spacers and the second set of spacers as a mask, the etching forming second strips of charge storage material elongated in the first direction across the surface of the substrate with strips of dielectric material between the charge storage material and the surface of the substrate, wherein etching the first layer of charge storage material using the spacers as a mask divides the first strips of the first layer of charge storage material along their lengths in the second direction thereby forming from each first strip a row of charge storage regions, wherein each second strip is discontinuous in the first direction and includes a column of charge storage regions; and
    etching the substrate to form trenches elongated in the first direction between second strips of charge storage material adjacent in the second direction.

2. The method of claim 1, further comprising:
filling the trenches with an insulating material.

3. The method of claim 1, wherein:
    etching the first layer of charge storage material using the spacers as a mask includes etching the strips of conductive material along their lengths in the second direction thereby forming discontinuous rows of control gates; and
    the method further comprising forming a second set of strips of conductive material elongated in the second direction and spaced apart in the first direction, the second set of strips being individually electrically connected to a row of control gates thereby forming a plurality of word lines.

4. The method of claim 1, wherein the space between second spacers adjacent in the first direction is substantially equal to a combined length of one spacer of the first set and two spacers of the second set.

5. The method of claim 1, wherein:
the first set of spacers are formed of polysilicon; and
the second set of spacers are formed of polysilicon.

6. The method of claim 1, wherein:
the first set of spacers are formed of a first material; and
the second set of spacers are formed of a different material.

7. The method of claim 6, wherein:
the first material is an oxide; and
the second material is a nitride.

8. The method of claim 2, wherein each column of charge storage regions is part of a NAND string of flash memory cells.

* * * * *